United States Patent
Lee et al.

(10) Patent No.: US 9,172,328 B2
(45) Date of Patent: Oct. 27, 2015

(54) VOLTAGE CONTROLLED OSCILLATOR AND PHASE LOCKED LOOP INCLUDING THE SAME

(71) Applicant: Samsung Electronics Co., Ltd., Suwon-Si, Gyeonggi-Do (KR)

(72) Inventors: Sang-Hun Lee, Pyeongtaek-si (KR); Jong-Shin Shin, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/504,875

(22) Filed: Oct. 2, 2014

(65) Prior Publication Data

US 2015/0180414 A1    Jun. 25, 2015

(30) Foreign Application Priority Data

Dec. 23, 2013  (KR) .......................... 10-2013-0161021

(51) Int. Cl.
    *H03L 7/06*   (2006.01)
    *H03B 7/06*   (2006.01)
    *H03L 7/089*  (2006.01)
    *H03L 7/099*  (2006.01)

(52) U.S. Cl.
    CPC ................ *H03B 7/06* (2013.01); *H03L 7/0891* (2013.01); *H03L 7/099* (2013.01)

(58) Field of Classification Search
    USPC .................................. 327/147–149, 156–158
    See application file for complete search history.

(56) References Cited

U.S. PATENT DOCUMENTS

| | | | |
|---|---|---|---|
| 6,121,850 A | 9/2000 | Ghoshal | |
| 6,680,655 B2 | 1/2004 | Rogers | |
| 7,119,624 B2 | 10/2006 | Gomez | |
| 7,286,625 B2 | 10/2007 | Lee et al. | |
| 7,319,731 B2 | 1/2008 | Wu | |
| 7,403,063 B2 | 7/2008 | Tu et al. | |
| 7,592,875 B2 | 9/2009 | Maget et al. | |
| 7,626,449 B2 | 12/2009 | Tu et al. | |
| 7,778,351 B2 * | 8/2010 | Hsu et al. | ...................... 375/297 |

(Continued)

*Primary Examiner* — Adam Houston
(74) *Attorney, Agent, or Firm* — Harness, Dickey & Pierce, P.L.C.

(57) ABSTRACT

A voltage controlled oscillator (VCO) includes an oscillation frequency signal generation circuit and a transconductance control circuit. The oscillation frequency signal generation circuit has a first transconductance and generates a first oscillation frequency signal and a second oscillation frequency signal based on a voltage control signal and a power supply voltage. The first and second oscillation frequency signals are a pair of differential signals. The oscillation frequency signal generation circuit is configured to output the first oscillation frequency signal from a first output node. The oscillation frequency signal generation circuit is configured to output the second oscillation frequency signal from a second output node. The transconductance control circuit is connected to the first and second output nodes and has a second transconductance. The transconductance control circuit is configured to adjust the second transconductance based on a digital control signal.

20 Claims, 14 Drawing Sheets

(56) References Cited

U.S. PATENT DOCUMENTS

| | | |
|---|---|---|
| 7,786,812 B2 | 8/2010 | McCorquodale et al. |
| 7,847,650 B2 | 12/2010 | Yao et al. |
| 7,885,629 B2 | 2/2011 | Ojo et al. |
| 7,974,376 B2 | 7/2011 | Wu |
| 8,116,677 B2 | 2/2012 | Rofougaran et al. |
| 8,390,371 B2 | 3/2013 | Ardehali |
| 8,493,156 B2 | 7/2013 | Cao |
| 8,508,308 B2 | 8/2013 | Dong et al. |
| 8,514,028 B2 | 8/2013 | Ding et al. |
| 2009/0002079 A1 | 1/2009 | Venuti et al. |
| 2011/0018645 A1* | 1/2011 | Chang et al. ............. 331/115 |
| 2011/0199137 A1* | 8/2011 | Nagaraj et al. ........... 327/157 |
| 2012/0040627 A1* | 2/2012 | Fujiwara et al. ........... 455/75 |
| 2012/0112808 A1* | 5/2012 | Yotsuji ..................... 327/156 |
| 2012/0112842 A1 | 5/2012 | Ainspan et al. |
| 2013/0154697 A1* | 6/2013 | Katsushima .............. 327/157 |
| 2013/0222026 A1* | 8/2013 | Havens .................... 327/158 |
| 2013/0278303 A1* | 10/2013 | Chen et al. ............... 327/117 |
| 2014/0070898 A1* | 3/2014 | Shirinfar et al. ...... 331/117 FE |
| 2014/0292417 A1* | 10/2014 | Canard et al. ............. 331/17 |
| 2015/0061737 A1* | 3/2015 | Abbasi et al. ............ 327/157 |

\* cited by examiner

VOLTAGE CONTROLLED OSCILLATOR AND PHASE LOCKED LOOP INCLUDING THE SAME

CROSS-REFERENCE TO RELATED APPLICATION

This application claims priority under 35 U.S.C. §119 to Korean Patent Application No. 10-2013-0161021, filed on Dec. 23, 2013 in the Korean Intellectual Property Office (KIPO), the contents of which are herein incorporated by reference in their entirety.

BACKGROUND

1. Technical Field

Example embodiments relate generally to voltage controlled oscillators (VCOs), such as VCOs being applicable to various integrated circuits and phase locked loops (PLLs) including the VCOs.

2. Description of the Related Art

A VCO controls a frequency of an output signal based on a voltage of an input signal. VCOs can be roughly divided into two categories depending upon a structure. These categories include a ring VCO, which includes a plurality of inverters, and a LC VCO, which includes an inductor and a capacitor. The VCO may be included in various integrated circuits, such as a PLL. Recently, various technologies have been researched for operating the VCO based on a relatively low power supply voltage.

SUMMARY

Accordingly, inventive concepts are provided to substantially obviate one or more problems due to limitations and disadvantages of the related art.

Some example embodiments provide a voltage controlled oscillator (VCO) capable of efficiently controlling a transconductance of the VCO.

Some example embodiments provide a phase locked loop (PLL) including the VCO.

According to some example embodiments, a voltage controlled oscillator (VCO) includes an oscillation frequency signal generation circuit and a transconductance control circuit. The oscillation frequency signal generation circuit has a first transconductance and generates a first oscillation frequency signal and a second oscillation frequency signal based on a voltage control signal and a power supply voltage. The first and second oscillation frequency signals are a pair of differential signals. The oscillation frequency signal generation circuit is configured to output the first oscillation frequency signal from a first output node. The oscillation frequency signal generation circuit is configured to output the second oscillation frequency signal from a second output node. The transconductance control circuit is connected to the first and second output nodes and has a second transconductance. The transconductance control circuit is configured to adjust the second transconductance based on a digital control signal. The VCO has a negative resistance based on the first transconductance and the second transconductance.

The transconductance control circuit may include a plurality of sub-control blocks connected in parallel between the first output node and the second output node. The transconductance control circuit is configured to selectively enable each sub-control block based on a respective one bit of the digital control signal.

Each sub-control block may have a sub-transconductance, and the second transconductance may correspond to a sum of sub-transconductances of enabled sub-control blocks.

In an example embodiment, each sub-control block may include a first n-type metal oxide semiconductor (NMOS) transistor, a second NMOS transistor and a third NMOS transistor. The first NMOS transistor may have a first electrode connected to the first output node, a control electrode connected to the second output node and a second electrode connected to a first common node. The second NMOS transistor may have a first electrode connected to the second output node, a control electrode connected to the first output node and a second electrode connected to the first common node. The third NMOS transistor may have a first electrode connected to the first common node, a control electrode configured to receive the respective one bit of the digital control signal and a second electrode configured to receive a ground voltage.

In an example embodiment, each sub-control block may include a first p-type metal oxide semiconductor (PMOS) transistor, a second PMOS transistor and a third PMOS transistor. The first PMOS transistor may have a first electrode configured to receive the power supply voltage, a control electrode configured to receive a respective one bit of an inversion signal of the digital control signal and a second electrode connected to a first common node. The second PMOS transistor may have a first electrode connected to the first common node, a control electrode connected to the second output node and a second electrode connected to the first output node. The third PMOS transistor may have a first electrode connected to the first common node, a control electrode connected to the first output node and a second electrode connected to the second output node.

In an example embodiment, each sub-control block may further include a first NMOS transistor, a second NMOS transistor and a third NMOS transistor. The first NMOS transistor may have a first electrode connected to the first output node, a control electrode connected to the second output node and a second electrode connected to a second common node. The second NMOS transistor may have a first electrode connected to the second output node, a control electrode connected to the first output node and a second electrode connected to the second common node. The third NMOS transistor may have a first electrode connected to the second common node, a control electrode configured to receive the respective one bit of the digital control signal and a second electrode configured to receive a ground voltage.

In an example embodiment, sub-transconductances of the plurality of sub-control blocks may be substantially the same as each other.

In an example embodiment, the oscillation frequency signal generation circuit may include an inductor, a plurality of capacitors, a varactor, a first NMOS transistor and a second NMOS transistor. The inductor may be connected between the first output node and the second output node. The inductor is configured to receive the power supply voltage. The plurality of capacitors may be connected in parallel between the first output node and the second output node. The varactor may be connected between the first output node and the second output node, and may have a capacitance based on the voltage control signal. The first NMOS transistor may have a first electrode connected to the first output node, a control electrode connected to the second output node and a second electrode configured to receive a ground voltage. The second NMOS transistor may have a first electrode connected to the second output node, a control electrode connected to the first output node and a second electrode configured to receive the ground voltage.

In an example embodiment, the oscillation frequency signal generation circuit may further include a first resistor. The first resistor may be connected between a power supply voltage source and the inductor. The power supply voltage source is configured to generate the power supply voltage.

In an example embodiment, the oscillation frequency signal generation circuit may further include a first resistor. The first resistor may be connected between the first and second NMOS transistors and a ground voltage source.

In an example embodiment, the oscillation frequency signal generation circuit may include a first PMOS transistor, a second PMOS transistor, a plurality of capacitors, a varactor and an inductor. The first PMOS transistor may have a first electrode configured to receive the power supply voltage, a control electrode connected to the second output node and a second electrode connected to the first output node. The second PMOS transistor may have a first electrode configured to receive the power supply voltage, a control electrode connected to the first output node and a second electrode connected to the second output node. The plurality of capacitors may be connected in parallel between the first output node and the second output node. The varactor may be connected between the first output node and the second output node, and may have a capacitance based on the voltage control signal. The inductor may be connected between the first output node and the second output node. The inductor is configured to receive a ground voltage.

In an example embodiment, the oscillation frequency signal generation circuit may include a first PMOS transistor, a second PMOS transistor, an inductor, a plurality of capacitors, a varactor, a first NMOS transistor and a second NMOS transistor. The first PMOS transistor may have a first electrode configured to receive the power supply voltage, a control electrode connected to the second output node and a second electrode connected to the first output node. The second PMOS transistor may have a first electrode configured to receive the power supply voltage, a control electrode connected to the first output node and a second electrode connected to the second output node. The inductor may be connected between the first output node and the second output node. The plurality of capacitors may be connected in parallel between the first output node and the second output node. The varactor may be connected between the first output node and the second output node, and may have a capacitance based on the voltage control signal. The first NMOS transistor may have a first electrode connected to the first output node, a control electrode connected to the second output node and a second electrode configured to receive a ground voltage. The second NMOS transistor may have a first electrode connected to the second output node, a control electrode connected to the first output node and a second electrode configured to receive the ground voltage.

In an example embodiment, the VCO may be a LC VCO including at least one inductor and at least one capacitor.

In an example embodiment, the negative resistance corresponds to a negative representation of a first resistance, the first resistance corresponds to a reciprocal of a third transconductance, and the third transconductance corresponds to a sum of the first transconductance and the second transconductance.

According to some example embodiments, a phase locked loop (PLL) includes a phase frequency detector, a charge pump, a loop filter, a voltage controlled oscillator (VCO), a frequency divider and a detector. The phase frequency detector generates an up signal and a down signal corresponding to a phase difference and a frequency difference between a reference signal and a feedback signal. The charge pump generates a current control signal based on the up signal and the down signal. The loop filter generates a voltage control signal by filtering the current control signal. The VCO generates an oscillation frequency signal based on the voltage control signal and a digital control signal. The frequency divider generates the feedback signal by dividing the oscillation frequency signal. The detector generates the digital control signal by detecting information of the oscillation frequency signal. The oscillation frequency signal corresponds to one of a first oscillation frequency signal and a second oscillation frequency signal being a pair of differential signals. The VCO includes an oscillation frequency signal generation circuit and a transconductance control circuit. The oscillation frequency signal generation circuit has a first transconductance and generates the first and second oscillation frequency signals based on the voltage control signal and a power supply voltage. The oscillation frequency signal generation circuit is configured to output the first oscillation frequency signal from a first output node. The oscillation frequency signal generation circuit is configured to output the second oscillation frequency signal from a second output node. The transconductance control circuit is connected to the first and second output nodes and has a second transconductance. The transconductance control circuit is configured to adjust the second transconductance based on the digital control signal. The VCO has a negative resistance of the VCO based on the first transconductance and the second transconductance.

Accordingly, the VCO according to example embodiments may include the transconductance control circuit having a plurality of transistors each of which is selectively turned on based on the digital control signal, and thus the VCO may have a tunable transconductance. The transconductance of the VCO may be efficiently controlled digitally without losses of headroom on the first and second oscillation frequency signals, which are generated from the VCO. The VCO may normally operate with a relatively low power supply voltage, a transconductance for satisfying an oscillation condition of the VCO may be efficiently determined, and thus the PLL including the VCO may have a relatively improved performance.

At least one example embodiment discloses a voltage controlled oscillator (VCO) configured to generate an output frequency signal based on a transconductance of the VCO, the VCO including an oscillation frequency signal generation circuit configured to generate the output frequency signal and a transconductance control circuit configured to adjust the transconductance of the VCO based on a digital control signal.

In an example embodiment, the oscillation frequency signal generation circuit includes first and second output nodes, and the transconductance control circuit is connected between the first and second output nodes.

In an example embodiment, the transconductance control circuit includes a plurality of sub-control blocks connected in parallel between the first output node and the second output node, the transconductance control circuit configured to selectively enable each sub-control block based on a respective one bit of the digital control signal.

In an example embodiment, the digital control signal is based on an amplitude of the output frequency signal.

In an example embodiment, the oscillation frequency signal generation circuit does not include a resistor.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
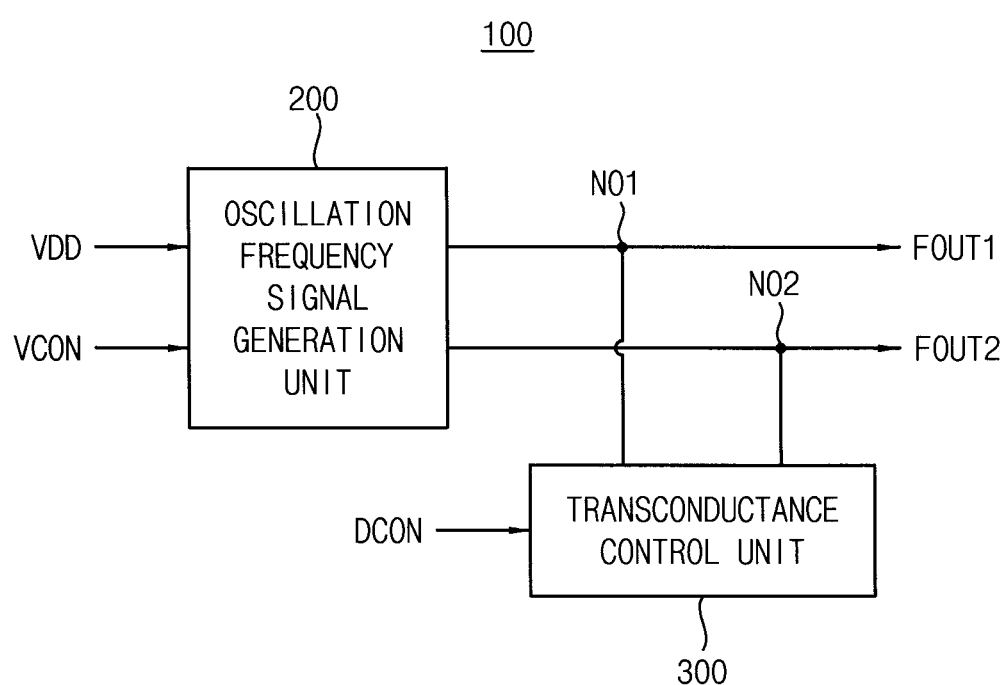
FIG. 1 is a block diagram illustrating a voltage controlled oscillator (VCO) according to an example embodiment.

Various example embodiments will be described more fully with reference to the accompanying drawings, in which embodiments are shown. Inventive concepts may, however, be embodied in many different forms and should not be construed as limited to the embodiments set forth herein. Rather, example embodiments are provided so that this disclosure will be thorough and complete, and will fully convey the scope of inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a voltage controlled oscillator (VCO) according to an example embodiment.

Referring to FIG. 1, a VCO 100 includes an oscillation frequency signal generation unit 200 and a transconductance control unit 300. The oscillation frequency signal generation unit 200 and the transconductance control unit 300 may also be referred to as an oscillation frequency signal generation circuit and a transconductance control circuit, respectively.

The oscillation frequency signal generation unit 200 generates a first oscillation frequency signal FOUT1 and a second oscillation frequency signal FOUT2 based on a voltage control signal VCON and a power supply voltage VDD. The first and second oscillation frequency signals FOUT1 and FOUT2 are a pair of differential signals. The first oscillation frequency signal FOUT1 is output from a first output node NO1, and the second oscillation frequency signal FOUT2 is output from a second output node NO2. The first and second output nodes NO1 and NO2 may be included in the oscillation frequency signal generation unit 200. The oscillation frequency signal generation unit 200 has a first transconductance. For example, the first transconductance may be determined based on at least one transistor included in the oscillation frequency signal generation unit 200.

The transconductance control unit 300 is connected to the first and second output nodes NO1 and NO2. The transconductance control unit 300 has a second transconductance that is tunable based on a digital control signal DCON. For example, the second transconductance may be determined based on at least one transistor included in the transconductance control unit 300 and may be tunable based on whether the at least one transistor included in the transconductance control unit 300 is turned on.

The VCO 100 has a negative resistance that is determined based on the first transconductance and the second transconductance. For example, the negative resistance of the VCO 100 may correspond to a negative representation of a first resistance, the first resistance may correspond to a reciprocal of a third transconductance, and the third transconductance may correspond to a sum of the first transconductance and the second transconductance. In other words, the negative resistance of the VCO 100 may be represented by Equation 1.

$$RN = -\frac{1}{GMtotal} \qquad \text{[Equation 1]}$$

In the Equation 1, RN represents the negative resistance of the VCO 100, and GMtotal represents the third transconductance, which corresponds to a total transconductance of the VCO 100.

In some example embodiments, the VCO 100 may be a LC VCO that includes at least one inductor and at least one capacitor.

The VCO 100 includes the transconductance control unit 300, and thus the VCO 100 may have a tunable transconductance. For example, as will be described with reference to FIGS. 2 through 10, the transconductance control unit 300 does not include a current source and includes a plurality of transistors that are selectively turned on based on the digital control signal DCON. The transconductance of the VCO 100 may be efficiently controlled digitally without losses of headroom on the first and second oscillation frequency signals FOUT1 and FOUT2, which are generated from the VCO 100. Accordingly, a transconductance for satisfying an oscillation condition of the VCO 100 may be efficiently determined, the VCO 100 may normally operate with a relatively low power supply voltage, and the VCO 100 may have a relatively low power consumption.

Figure 2:
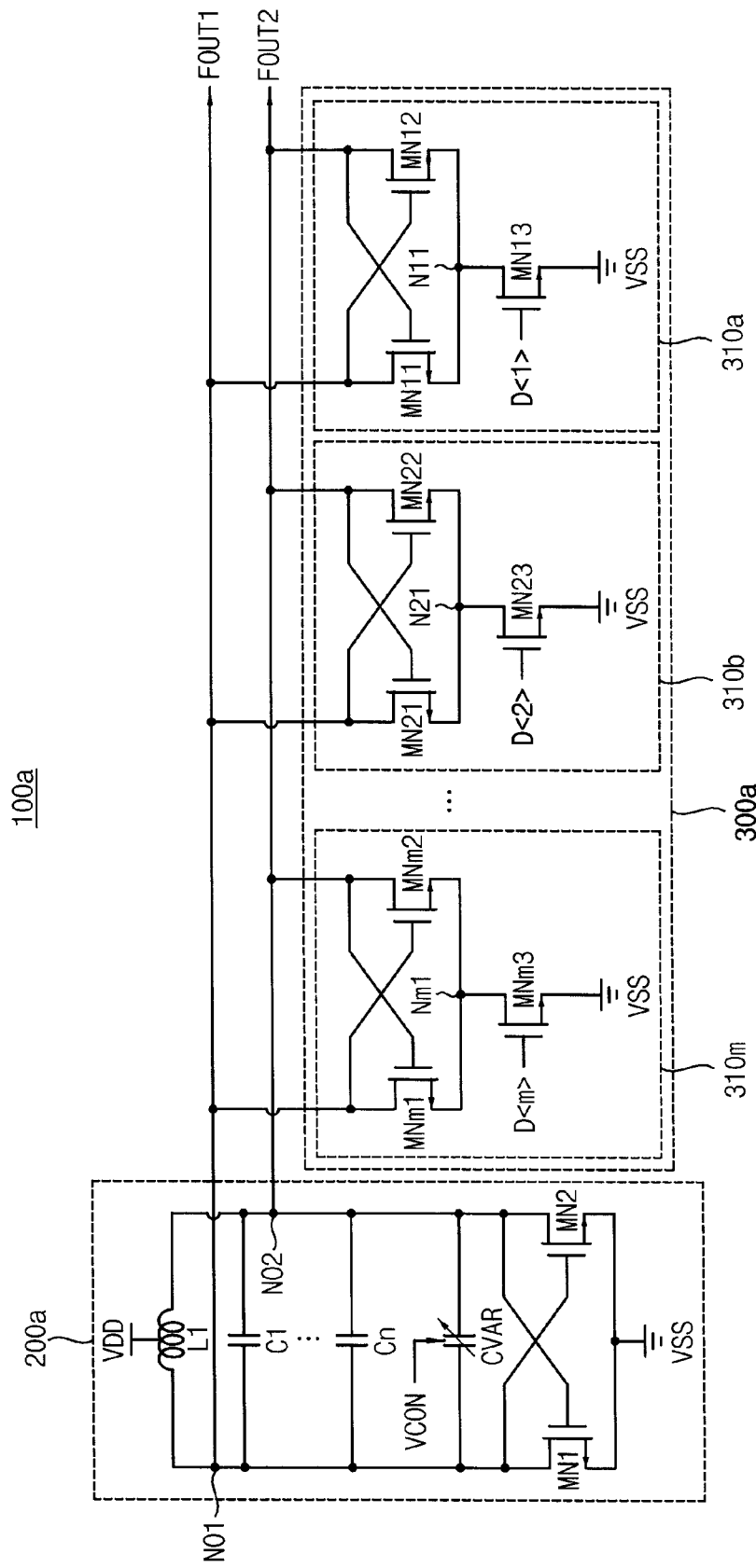
FIG. 2 is a circuit diagram illustrating an example embodiment of the VCO of FIG. 1.

FIG. 2 is a circuit diagram illustrating an example of the VCO of FIG. 1.

Referring to FIG. 2, a VCO 100a includes an oscillation frequency signal generation unit 200a and a transconductance control unit 300a. The VCO 100a of FIG. 2 may only include n-type metal oxide semiconductor (NMOS) transistors.

The oscillation frequency signal generation unit 200a may include an inductor L1, a plurality of capacitors C1, . . . , Cn, a varactor CVAR and NMOS transistors MN1 and MN2.

The inductor L1 may be connected between the first output node NO1 and the second output node NO2. The power supply voltage VDD may be applied to the inductor L1. The plurality of capacitors C1, . . . , Cn may be connected in parallel between the first output node NO1 and the second output node NO2. The varactor CVAR may be connected between the first output node NO1 and the second output node NO2. The varactor CVAR may have a capacitance that is variable based on the voltage control signal VCON.

First electrodes (e.g., drain electrodes) and control electrodes (e.g., gate electrodes) of the NMOS transistors MN1 and MN2 may be cross-coupled. For example, the NMOS transistor MN1 may have a first electrode connected to the first output node NO1, a control electrode connected to the second output node NO2 and a second electrode receiving a ground voltage VSS. The NMOS transistor MN2 may have a first electrode connected to the second output node NO2, a control electrode connected to the first output node NO1 and a second electrode receiving the ground voltage VSS.

A first transconductance of the oscillation frequency signal generation unit 200a may be determined based on the inductor L1, the plurality of capacitors C1, . . . , Cn, the varactor CVAR and the NMOS transistors MN1 and MN2.

The transconductance control unit 300a may include a plurality of sub-control blocks 310a, 310b, . . . , 310m. The plurality of sub-control blocks 310a, 310b, . . . , 310m may be connected in parallel between the first output node NO1 and the second output node NO2. Each of the plurality of sub-control blocks 310a, 310b, . . . , 310m may be selectively enabled based on a respective one bit of the digital control signal. For example, a first sub-control block 310a may be selectively enabled based on a first bit D<1> of the digital control signal, a second sub-control block 310b may be selectively enabled based on a second bit D<2> of the digital control signal, and a m-th sub-control block 310m may be selectively enabled based on a m-th bit D<m> of the digital control signal, where m is a natural number equal to or greater than two.

Similarly to the oscillation frequency signal generation unit 200a, each of the plurality of sub-control blocks 310a, 310b, . . . , 310m may include NMOS transistors, where first electrodes and control electrodes of the NMOS transistors are cross-coupled. For example, each of the plurality of sub-control blocks 310a, 310b, . . . , 310m may include a respective one of NMOS transistors MN11, MN21, . . . , MNm1, a respective one of NMOS transistors MN12, MN22, . . . , MNm2 and a respective one of NMOS transistors MN13, MN23, . . . , MNm3. Each of the NMOS transistors MN11, MN21, . . . , MNm1 may have a first electrode connected to the first output node NO1, a control electrode connected to the second output node NO2 and a second electrode connected to a respective one of nodes N11, N21, . . . , Nm1. Each of the NMOS transistors MN12, MN22, . . . , MNm2 may have a first electrode connected to the second output node NO2, a control electrode connected to the first output node NO1 and a second electrode connected to the respective one of the nodes N11, N21, . . . , Nm1. Each of the NMOS transistors MN13, MN23, . . . , MNm3 may have a first electrode connected to the respective one of the nodes N11, N21, . . . , Nm1, a control electrode receiving the respective one bit of the digital control signal and a second electrode receiving the ground voltage VSS.

For example, the first sub-control block 310a may include a first NMOS transistor MN11, a second NMOS transistor MN12 and a third NMOS transistor MN13. The first NMOS transistor MN11 may have a first electrode connected to the first output node NO1, a control electrode connected to the second output node NO2 and a second electrode connected to a first node N11. The second NMOS transistor MN12 may have a first electrode connected to the second output node NO2, a control electrode connected to the first output node NO1 and a second electrode connected to the first node N11. The third NMOS transistor MN13 may have a first electrode connected to the first node N11, a control electrode receiving the first bit D<1> of the digital control signal and a second electrode receiving the ground voltage VSS.

Each of the plurality of sub-control blocks 310a, 310b, . . . , 310m may have a sub-transconductance. For example, the first sub-control block 310a may have a first sub-transconductance, the second sub-control block 310b may have a second sub-transconductance, and the m-th sub-control block 310m may have a m-th sub-transconductance. A second transconductance of the transconductance control unit 300a may correspond to a sum of sub-transconductances of enabled sub-control blocks.

In an example embodiment, the sub-transconductances of the plurality of sub-control blocks 310a, 310b, . . . , 310m may be substantially the same as each other. In other words, the first through m-th sub-transconductances may be substantially the same as each other. In this case, assuming that k sub-control blocks are enabled based on the digital control signal, where k is an integer equal to or greater than zero and equal to or smaller than m, a third transconductance (e.g., a total transconductance) of the VCO 100*a* may be represented by Equation 2.

$$GMtotal = GMoriginal + k \cdot GMsub \quad \text{[Equation 2]}$$

In the Equation 2, GMoriginal represents the first transconductance of the oscillation frequency signal generation unit 200*a*, and GMsub represents the sub-transconductance of each of the plurality of sub-control blocks 310*a*, 310*b*, ..., 310*m*. A negative resistance of the VCO 100*a* may be determined based on the Equation 1 and the GMtotal obtained by the Equation 2. The total transconductance and the negative resistance of the VCO 100*a* may be efficiently controlled digitally based on the number of the enabled sub-control blocks.

In another example embodiment, the sub-transconductances of the plurality of sub-control blocks 310*a*, 310*b*, ..., 310*m* may be different from each other. In other words, the first sub-transconductance may be different from the second through m-th sub-transconductances. In this case, assuming that the first and second sub-control blocks 310*a* and 310*b* are enabled based on the digital control signal, the third transconductance (e.g., the total transconductance) of the VCO 100*a* may be represented by Equation 3.

$$GMtotal = GMoriginal + GMsub\,1 + GMsub\,2 \quad \text{[Equation 3]}$$

In the Equation 3, GMsub1 represents the first sub-transconductance of the first sub-control block 310*a*, and GMsub2 represents the second sub-transconductance of the second sub-control block 310*b*. The negative resistance of the VCO 100*a* may be determined based on the Equation 1 and the GMtotal obtained by the Equation 3. The total transconductance and the negative resistance of the VCO 100*a* may be efficiently controlled digitally based on the number and the types of the enabled sub-control blocks. The GMtotal in the Equation 3 may be changed based on the number and the types of the enabled sub-control blocks.

In the VCO 100*a* of FIG. 2, the first and second oscillation frequency signals FOUT1 and FOUT2 may swing with respect to the power supply voltage VDD. In addition, voltage drops of the first and second oscillation frequency signals FOUT1 and FOUT2 may be reduced because the VCO 100*a* does not include a resistor. Thus, the losses of headroom on the first and second oscillation frequency signals FOUT1 and FOUT2 may be reduced.

Figure 3:
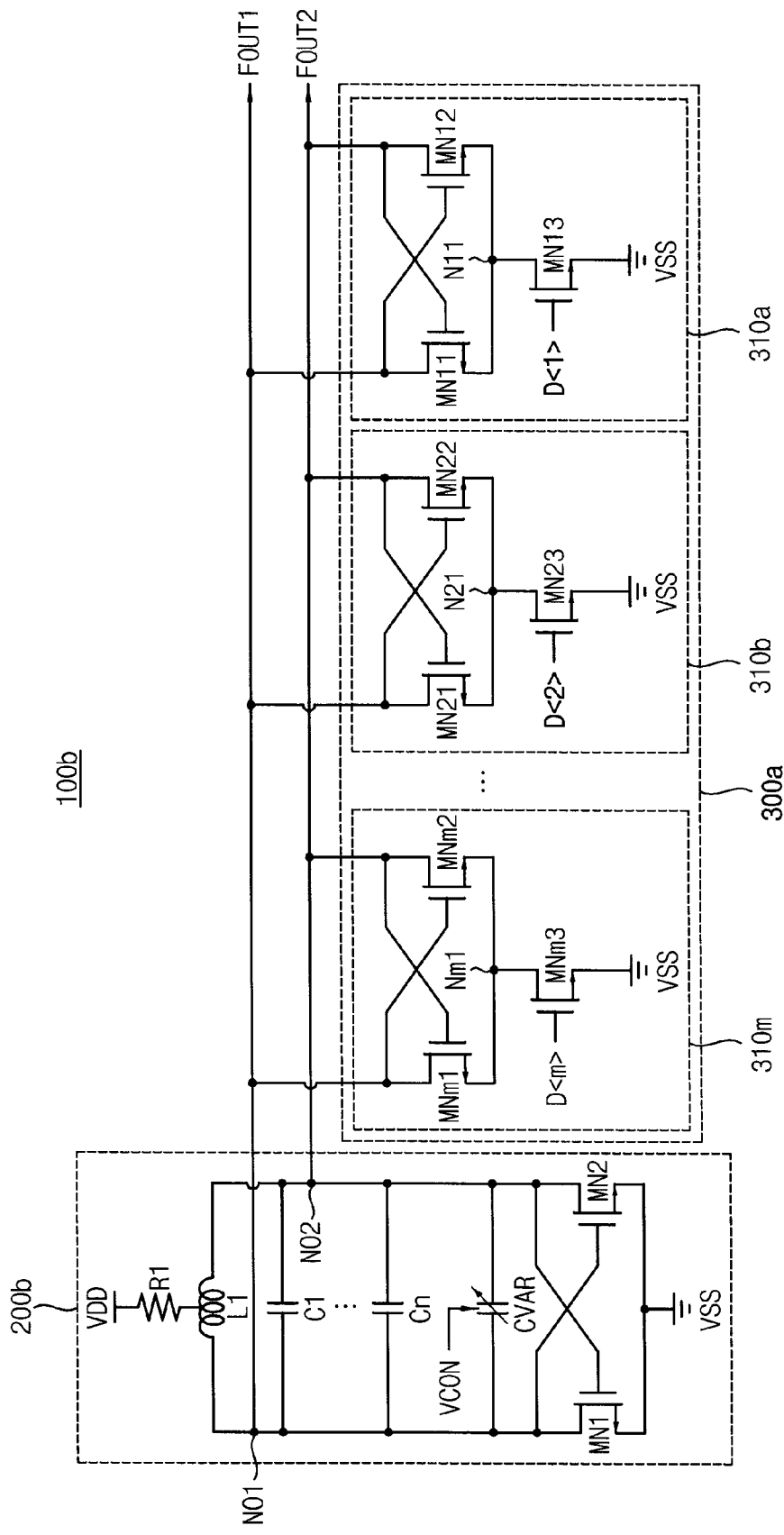
FIGS. 3 and 4 are circuit diagrams illustrating other example embodiments of the VCO of FIG. 1.
Figure 4:
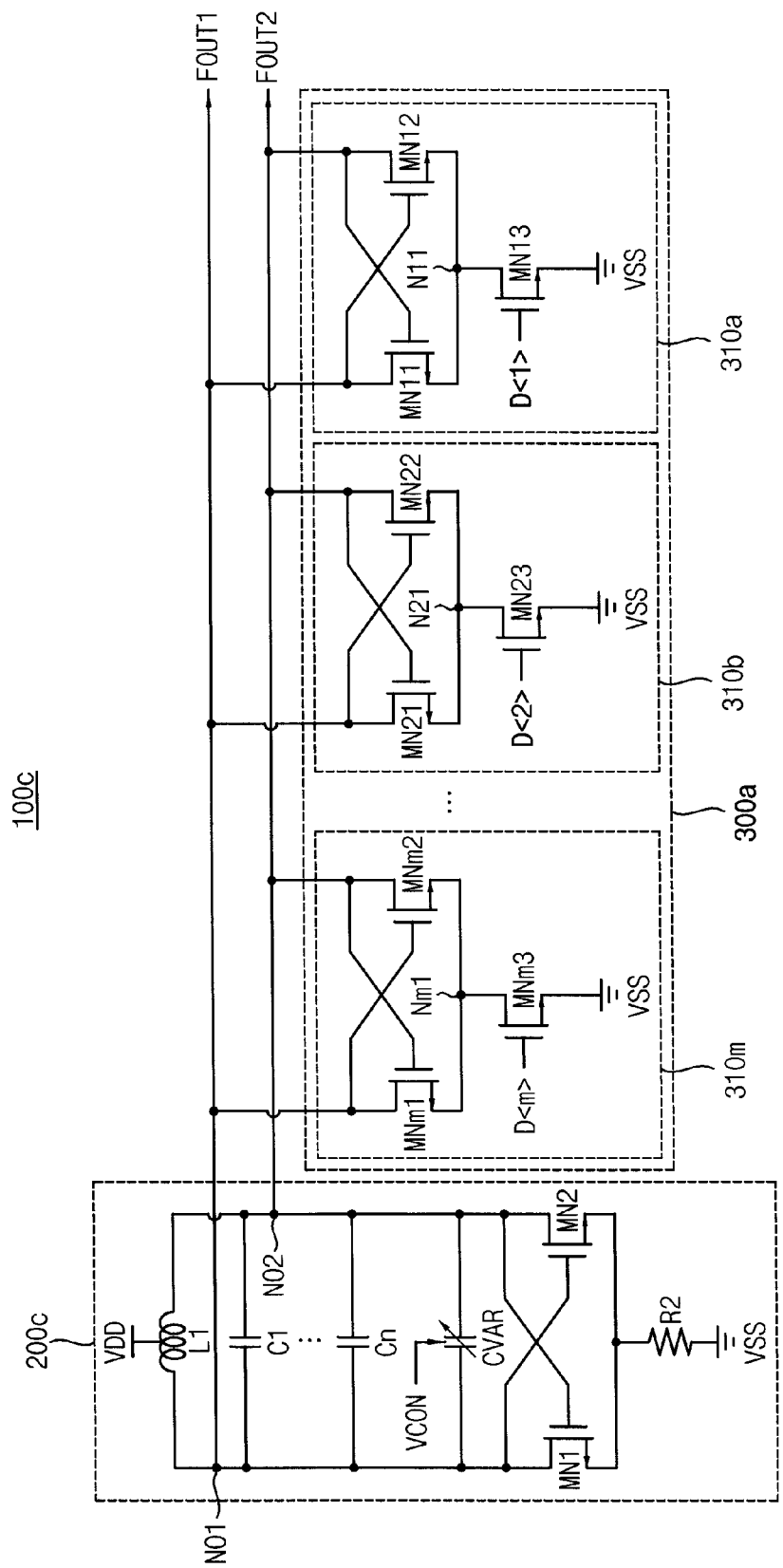

FIGS. 3 and 4 are circuit diagrams illustrating other examples of the VCO of FIG. 1.

Referring to FIG. 3, a VCO 100*b* includes an oscillation frequency signal generation unit 200*b* and the transconductance control unit 300*a*.

The oscillation frequency signal generation unit 200*b* may include a resistor R1, the inductor L1, the plurality of capacitors C1, Cn, the varactor CVAR and the NMOS transistors MN1 and MN2. The oscillation frequency signal generation unit 200*b* in FIG. 3 may be substantially the same as the oscillation frequency signal generation unit 200*a* in FIG. 2, except that the oscillation frequency signal generation unit 200*b* in FIG. 3 may further include the resistor R1 connected between the power supply voltage VDD and the inductor L1.

Referring to FIG. 4, a VCO 100*c* includes an oscillation frequency signal generation unit 200*c* and the transconductance control unit 300*a*.

The oscillation frequency signal generation unit 200*c* may include the inductor L1, the plurality of capacitors C1, ..., Cn, the varactor CVAR, the NMOS transistors MN1 and MN2 and a resistor R2. The oscillation frequency signal generation unit 200*c* in FIG. 4 may be substantially the same as the oscillation frequency signal generation unit 200*a* in FIG. 2, except that the oscillation frequency signal generation unit 200*c* in FIG. 4 may further include the resistor R2 connected between the NMOS transistors MN1 and MN2 and the ground voltage VSS.

In the VCO 100*b* of FIG. 3 and the VCO 100*c* of FIG. 4, the first and second oscillation frequency signals FOUT1 and FOUT2 may swing with respect to a first voltage lower than the power supply voltage VDD. There is a relatively small chance that maximum levels of the oscillation frequency signals FOUT1 and FOUT2 exceed a maximum limit level of an operating voltage of an electronic circuit, where the electronic circuit receives at least one of the oscillation frequency signals FOUT1 and FOUT2 from the VCO 100*b* of FIG. 3 or the VCO 100*c* of FIG. 4 as the operating voltage. Thus, reliability issues associated with the oscillation frequency signals FOUT1 and FOUT2 may be improved.

Figure 5:
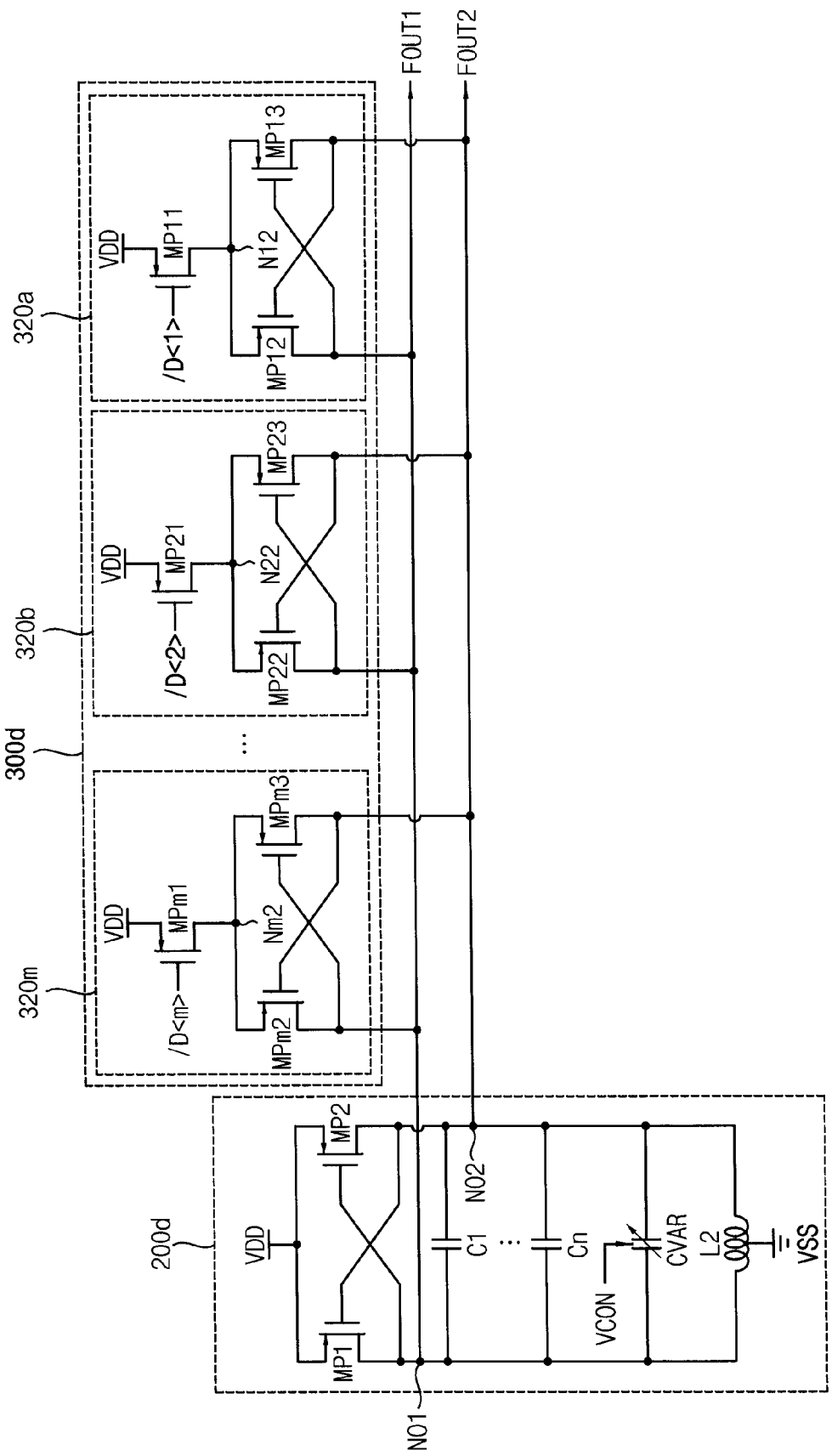
FIG. 5 is a circuit diagram illustrating another example embodiment of the VCO of FIG. 1.

FIG. 5 is a circuit diagram illustrating another example of the VCO of FIG. 1.

Referring to FIG. 5, a VCO 100*d* includes an oscillation frequency signal generation unit 200*d* and a transconductance control unit 300*d*. The VCO 100*d* of FIG. 5 may only include p-type metal oxide semiconductor (PMOS) transistors.

The oscillation frequency signal generation unit 200*d* may include PMOS transistors MP1 and MP2, the plurality of capacitors C1, ..., Cn, the varactor CVAR and an inductor L2.

Control electrodes (e.g., gate electrodes) and second electrodes (e.g., drain electrodes) of the PMOS transistors MP1 and MP2 may be cross-coupled. For example, the PMOS transistor MP1 may have a first electrode receiving the power supply voltage VDD, a control electrode connected to the second output node NO2 and a second electrode connected to the first output node NO1. The PMOS transistor MP2 may have a first electrode receiving the power supply voltage VDD, a control electrode connected to the first output node NO1 and a second electrode connected to the second output node NO2.

The plurality of capacitors C1, ..., Cn may be connected in parallel between the first output node NO1 and the second output node NO2. The varactor CVAR may be connected between the first output node NO1 and the second output node NO2. The varactor CVAR may have a capacitance that is variable based on the voltage control signal VCON. The inductor L2 may be connected between the first output node NO1 and the second output node NO2. The ground voltage VSS may be applied to the inductor L2.

A first transconductance of the oscillation frequency signal generation unit 200*d* may be determined based on the PMOS transistors MP1 and MP2, the plurality of capacitors C1, ..., Cn, the varactor CVAR and the inductor L2.

The transconductance control unit 300*d* may include a plurality of sub-control blocks 320*a*, 320*b*, ..., 320*m*. The plurality of sub-control blocks 320*a*, 320*b*, ..., 320*m* may be connected in parallel between the first output node NO1 and the second output node NO2. Each of the plurality of sub-control blocks 320*a*, 320*b*, ..., 320*m* may be selectively enabled based on a respective one bit of an inversion signal of the digital control signal. For example, a first sub-control block 320*a* may be selectively enabled based on a first bit /D<1> of the inversion signal of the digital control signal, a second sub-control block 320*b* may be selectively enabled based on a second bit /D<2> of the inversion signal of the digital control signal, and a m-th sub-control block 320*m* may be selectively enabled based on a m-th bit /D<m> of the inversion signal of the digital control signal, where m is a natural number equal to or greater than two.

Similarly to the oscillation frequency signal generation unit 200d, each of the plurality of sub-control blocks 320a, 320b, . . . , 320m may include PMOS transistors, where control electrodes and the second electrodes of the PMOS transistors are cross-coupled. For example, each of the plurality of sub-control blocks 320a, 320b, . . . , 320m may include a respective one of PMOS transistors MP11, MP21, . . . , MPm1, a respective one of PMOS transistors MP12, MP22, . . . , MPm2 and a respective one of PMOS transistors MP13, MP23, . . . , MPm3. Each of the PMOS transistors MP11, MP21, . . . , MPm1 may have a first electrode receiving the power supply voltage VDD, a control electrode receiving the respective one bit of the inversion signal of the digital control signal and a second electrode connected to a respective one of nodes N12, N22, . . . , Nm2. Each of the PMOS transistors MP12, MP22, . . . , MPm2 may have a first electrode connected to the respective one of the nodes N12, N22, . . . , Nm2, a control electrode connected to the second output node NO2 and a second electrode connected to the first output node NO1. Each of the PMOS transistors MP13, MP23, . . . , MPm3 may have a first electrode connected to the respective one of the nodes N12, N22, . . . , Nm2, a control electrode connected to the first output node NO1 and a second electrode connected to the second output node NO2.

For example, the first sub-control block 320a may include a first PMOS transistor MP11, a second PMOS transistor MP12 and a third PMOS transistor MP13. The first PMOS transistor MP11 may have a first electrode receiving the power supply voltage VDD, a control electrode receiving the first bit /D<1> of the inversion signal of the digital control signal and a second electrode connected to a first node N12. The second PMOS transistor MP12 may have a first electrode connected to the first node N12, a control electrode connected to the second output node NO2 and a second electrode connected to the first output node NO1. The third PMOS transistor MP13 may have a first electrode connected to the first node N12, a control electrode connected to the first output node NO1 and a second electrode connected to the second output node NO2.

Each of the plurality of sub-control blocks 320a, 320b, . . . , 320m may have a sub-transconductance. A second transconductance of the transconductance control unit 300d may correspond to a sum of sub-transconductances of enabled sub-control blocks.

In an example embodiment, the sub-transconductances of the plurality of sub-control blocks 320a, 320b, . . . , 320m may be substantially the same as each other. In this case, a total transconductance and a negative resistance of the VCO 100d may be controlled similarly to the example described above with reference to the Equation 2. In another example embodiment, the sub-transconductances of the plurality of sub-control blocks 320a, 320b, . . . , 320m may be different from each other. In this case, the total transconductance and the negative resistance of the VCO 100d may be controlled similarly to the example described above with reference to the Equation 3.

In the VCO 100d of FIG. 5, the first and second oscillation frequency signals FOUT1 and FOUT2 may swing with respect to the ground voltage VSS. The losses of headroom on the first and second oscillation frequency signals FOUT1 and FOUT2 may be reduced because the VCO 100d does not include a resistor.

Figure 6:
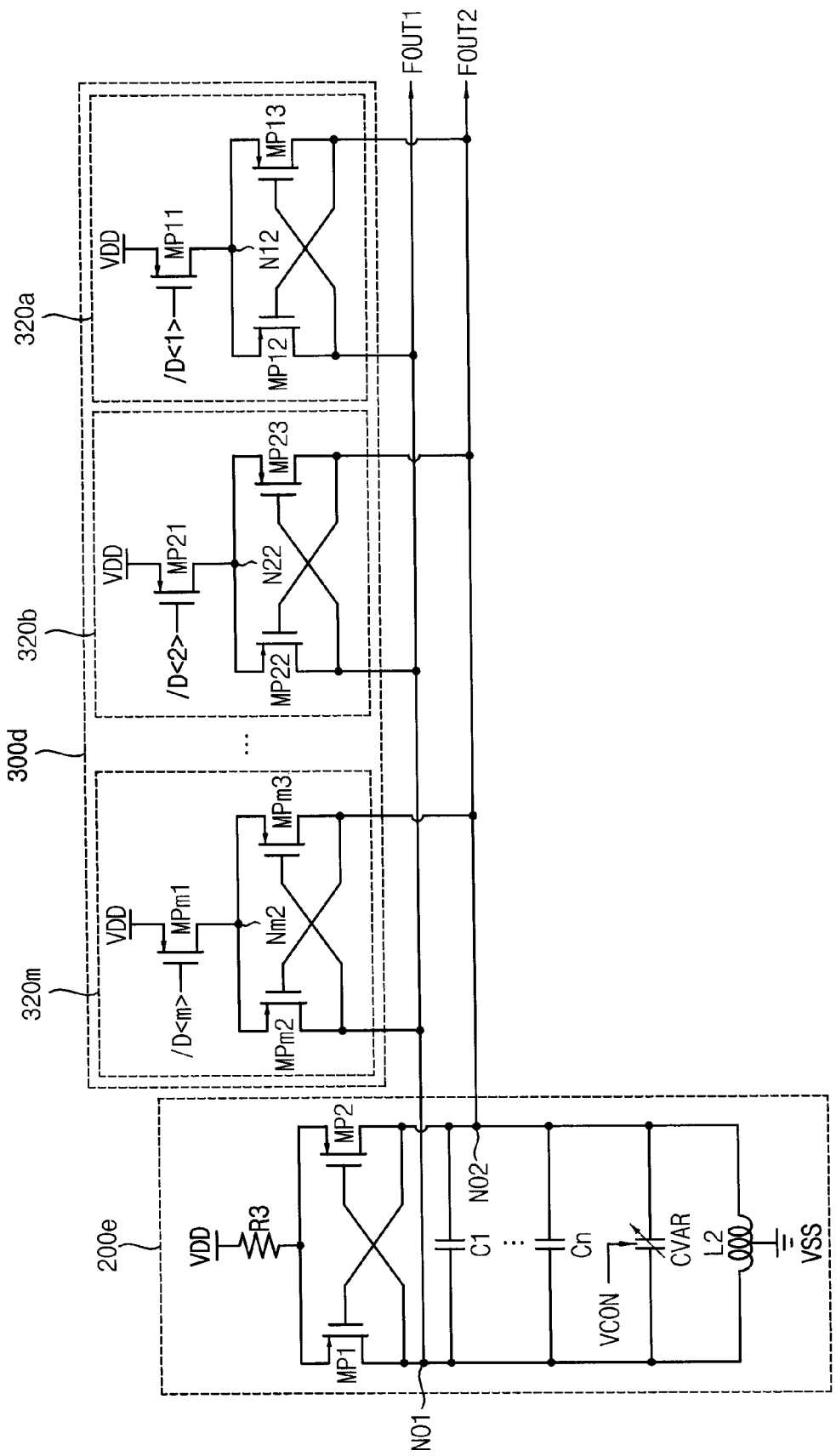
FIGS. 6 and 7 are circuit diagrams illustrating still other example embodiments of the VCO of FIG. 1.
Figure 7:
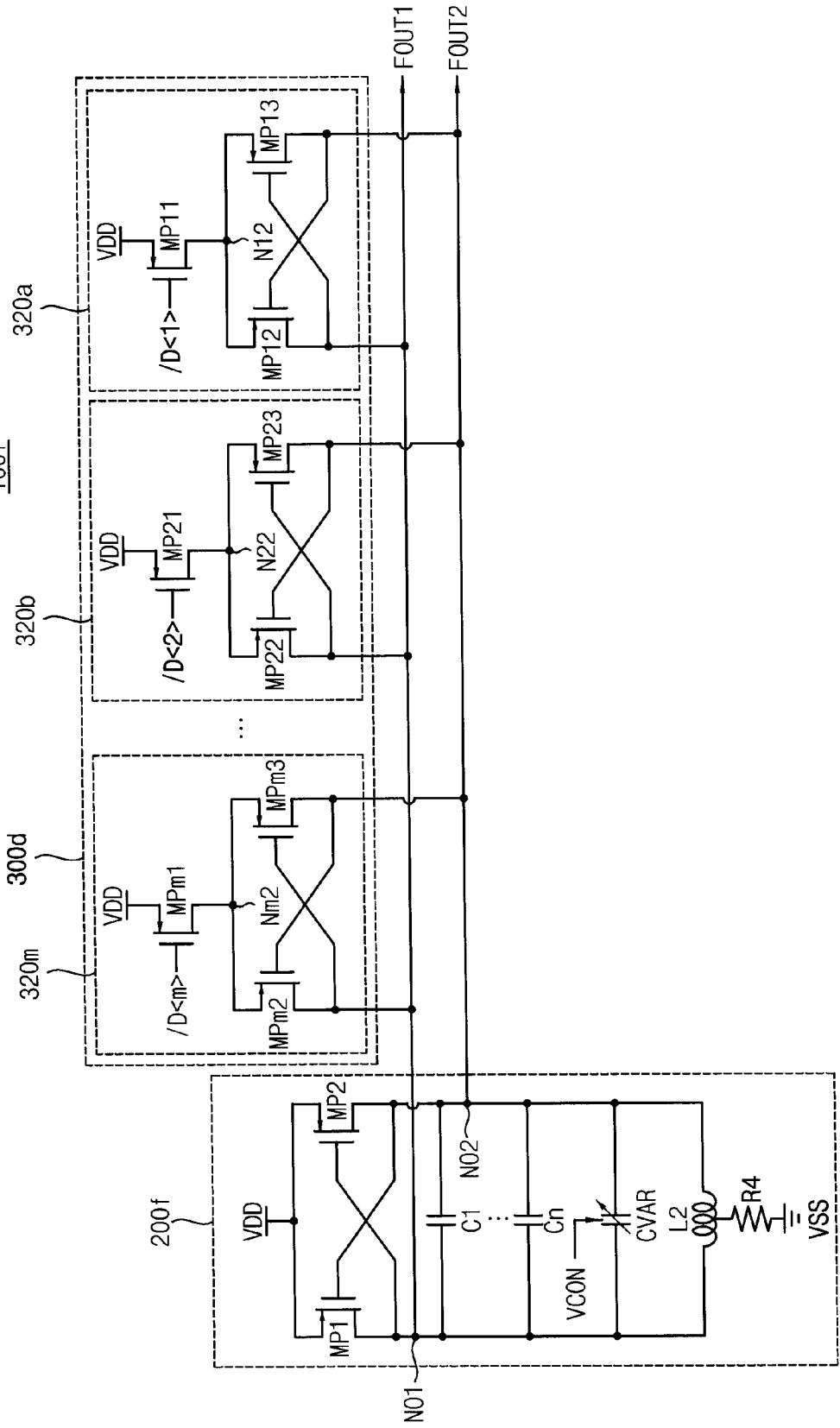

FIGS. 6 and 7 are circuit diagrams illustrating still other examples of the VCO of FIG. 1.

Referring to FIG. 6, a VCO 100e includes an oscillation frequency signal generation unit 200e and the transconductance control unit 300d.

The oscillation frequency signal generation unit 200e may include a resistor R3, the PMOS transistors MP1 and MP2, the plurality of capacitors C1, . . . , Cn, the varactor CVAR and the inductor L2. The oscillation frequency signal generation unit 200e in FIG. 6 may be substantially the same as the oscillation frequency signal generation unit 200d in FIG. 5, except that the oscillation frequency signal generation unit 200e in FIG. 6 may further include the resistor R3 connected between the power supply voltage VDD and the PMOS transistors MP1 and MP2.

Referring to FIG. 7, a VCO 100f includes an oscillation frequency signal generation unit 200f and the transconductance control unit 300d.

The oscillation frequency signal generation unit 200f may include the PMOS transistors MP1 and MP2, the plurality of capacitors C1, . . . , Cn, the varactor CVAR, the inductor L2 and a resistor R4. The oscillation frequency signal generation unit 200f in FIG. 7 may be substantially the same as the oscillation frequency signal generation unit 200d in FIG. 5, except that the oscillation frequency signal generation unit 200f in FIG. 7 may further include the resistor R4 connected between the inductor L2 and the ground voltage VSS.

In the VCO 100e of FIG. 6 and the VCO 100f of FIG. 7, the first and second oscillation frequency signals FOUT1 and FOUT2 may swing with respect to a second voltage higher than the ground voltage VSS. There is a relatively small chance that minimum levels of the oscillation frequency signals FOUT1 and FOUT2 is under a minimum limit level of an operating voltage of an electronic circuit, where the electronic circuit receives at least one of the oscillation frequency signals FOUT1 and FOUT2 from the VCO 100e of FIG. 6 or the VCO 100f of FIG. 7 as the operating voltage. Thus, reliability issues associated with the oscillation frequency signals FOUT1 and FOUT2 may be improved.

Figure 8:
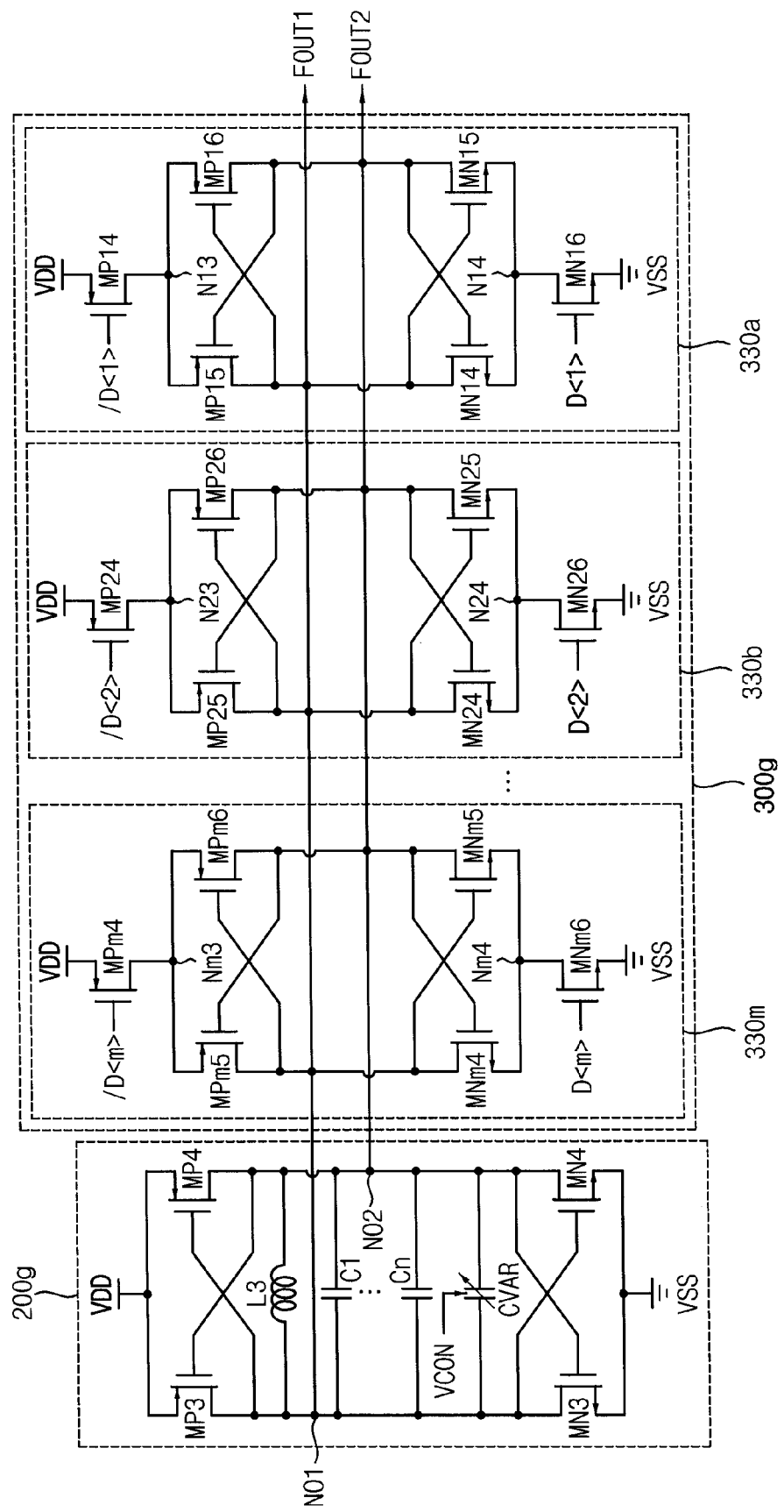
FIG. 8 is a circuit diagram illustrating still another example of the VCO of FIG. 1.

FIG. 8 is a circuit diagram illustrating still another example of the VCO of FIG. 1.

Referring to FIG. 8, a VCO 100g includes an oscillation frequency signal generation unit 200g and a transconductance control unit 300g. The VCO 100g of FIG. 8 may include PMOS transistors and NMOS transistors.

The oscillation frequency signal generation unit 200g may include PMOS transistors MP3 and MP4, an inductor L3, the plurality of capacitors C1, . . . , Cn, the varactor CVAR and NMOS transistors MN3 and MN4.

Control electrodes (e.g., gate electrodes) and second electrodes (e.g., drain electrodes) of the PMOS transistors MP3 and MP4 may be cross-coupled. For example, the PMOS transistor MP3 may have a first electrode receiving the power supply voltage VDD, a control electrode connected to the second output node NO2 and a second electrode connected to the first output node NO1. The PMOS transistor MP4 may have a first electrode receiving the power supply voltage VDD, a control electrode connected to the first output node NO1 and a second electrode connected to the second output node NO2.

The inductor L3 may be connected between the first output node NO1 and the second output node NO2. The plurality of capacitors C1, . . . , Cn may be connected in parallel between the first output node NO1 and the second output node NO2. The varactor CVAR may be connected between the first output node NO1 and the second output node NO2. The varactor CVAR may have a capacitance that is variable based on the voltage control signal VCON.

First electrodes (e.g., drain electrodes) and control electrodes (e.g., gate electrodes) of the NMOS transistors MN3 and MN4 may be cross-coupled. For example, the NMOS transistor MN3 may have a first electrode connected to the first output node NO1, a control electrode connected to the second output node NO2 and a second electrode receiving the ground voltage VSS. The NMOS transistor MN4 may have a first electrode connected to the second output node NO2, a control electrode connected to the first output node NO1 and a second electrode receiving the ground voltage VSS.

A first transconductance of the oscillation frequency signal generation unit 200g may be determined based on the PMOS transistors MP3 and MP4, the inductor L3, the plurality of capacitors C1, . . . , Cn, the varactor CVAR and the NMOS transistors MN3 and MN4.

The transconductance control unit 300g may include a plurality of sub-control blocks 330a, 330b, . . . , 330m. The plurality of sub-control blocks 330a, 330b, . . . , 330m may be connected in parallel between the first output node NO1 and the second output node NO2. Each of the plurality of sub-control blocks 330a, 330b, . . . , 330m may be selectively enabled based on a respective one bit of the digital control signal and a respective one bit of an inversion signal of the digital control signal. For example, a first sub-control block 330a may be selectively enabled based on a first bit D<1> of the digital control signal and a first bit /D<1> of the inversion signal of the digital control signal, a second sub-control block 330b may be selectively enabled based on a second bit D<2> of the digital control signal and a second bit /D<2> of the inversion signal of the digital control signal, and a m-th sub-control block 330m may be selectively enabled based on a m-th bit D<m> of the digital control signal and a m-th bit /D<m> of the inversion signal of the digital control signal, where m is a natural number equal to or greater than two.

Similarly to the oscillation frequency signal generation unit 200g, each of the plurality of sub-control blocks 330a, 330b, . . . , 330m may include PMOS transistors and NMOS transistors. For example, each of the plurality of sub-control blocks 330a, 330b, . . . , 330m may include a respective one of PMOS transistors MP14, MP24, . . . , MPm4, a respective one of PMOS transistors MP15, MP25, . . . , MPm5, a respective one of PMOS transistors MP16, MP26, . . . , MPm6, a respective one of NMOS transistors MN14, MN24, . . . , MNm4, a respective one of NMOS transistors MN15, MN25, . . . , MNm5 and a respective one of NMOS transistors MN16, MN26, . . . , MNm6.

Each of the PMOS transistors MP14, MP24, . . . , MPm4 may have a first electrode receiving the power supply voltage VDD, a control electrode receiving the respective one bit of the inversion signal of the digital control signal and a second electrode connected to a respective one of nodes N13, N23, . . . , Nm3. Each of the PMOS transistors MP15, MP25, . . . , MPm5 may have a first electrode connected to the respective one of the nodes N13, N23, . . . , Nm3, a control electrode connected to the second output node NO2 and a second electrode connected to the first output node NO1. Each of the PMOS transistors MP16, MP26, . . . , MPm6 may have a first electrode connected to the respective one of the nodes N13, N23, . . . , Nm3, a control electrode connected to the first output node NO1 and a second electrode connected to the second output node NO2. Each of the NMOS MN14, MN24, . . . , MNm4 may have a first electrode connected to the first output node NO1, a control electrode connected to the second output node NO2 and a second electrode connected to a respective one of nodes N14, N24, . . . , Nm4. Each of the NMOS transistors MN15, MN25, . . . , MNm5 may have a first electrode connected to the second output node NO2, a control electrode connected to the first output node NO1 and a second electrode connected to the respective one of the nodes N14, N24, . . . , Nm4. Each of the NMOS transistors MN16, MN26, . . . , MNm6 may have a first electrode connected to the respective one of the nodes N14, N24, . . . , Nm4, a control electrode receiving the respective one bit of the digital control signal and a second electrode receiving the ground voltage VSS.

For example, the first sub-control block 330a may include a first PMOS transistor MP14, a second PMOS transistor MP15, a third PMOS transistor MP16, a first NMOS transistor MN14, a second NMOS transistor MN15 and a third NMOS transistor MN16. The first PMOS transistor MP14 may have a first electrode receiving the power supply voltage VDD, a control electrode receiving the first bit /D<1> of the inversion signal of the digital control signal and a second electrode connected to a first node N13. The second PMOS transistor MP15 may have a first electrode connected to the first node N13, a control electrode connected to the second output node NO2 and a second electrode connected to the first output node NO1. The third PMOS transistor MP16 may have a first electrode connected to the first node N13, a control electrode connected to the first output node NO1 and a second electrode connected to the second output node NO2. The first NMOS transistor MN14 may have a first electrode connected to the first output node NO1, a control electrode connected to the second output node NO2 and a second electrode connected to a second node N14. The second NMOS transistor MN15 may have a first electrode connected to the second output node NO2, a control electrode connected to the first output node NO1 and a second electrode connected to the second node N14. The third NMOS transistor MN16 may have a first electrode connected to the second node N14, a control electrode receiving the first bit D<1> of the digital control signal and a second electrode receiving the ground voltage VSS.

Each of the plurality of sub-control blocks 330a, 330b, . . . , 330m may have a sub-transconductance. A second transconductance of the transconductance control unit 300g may correspond to a sum of sub-transconductances of enabled sub-control blocks. According to example embodiments, the sub-transconductances of the plurality of sub-control blocks 330a, 330b, . . . , 330m may be substantially the same as each other or may be different from each other.

In the VCO 100g of FIG. 8, the oscillation frequency signal generation unit 200g and the transconductance control unit 300g may include the PMOS and NMOS transistors that are complementary cross-coupled. Thus, the VCO 100g of FIG. 8 may have a relatively low flicker noise and may have a relatively large transconductance based on a relatively low current.

Figure 9:
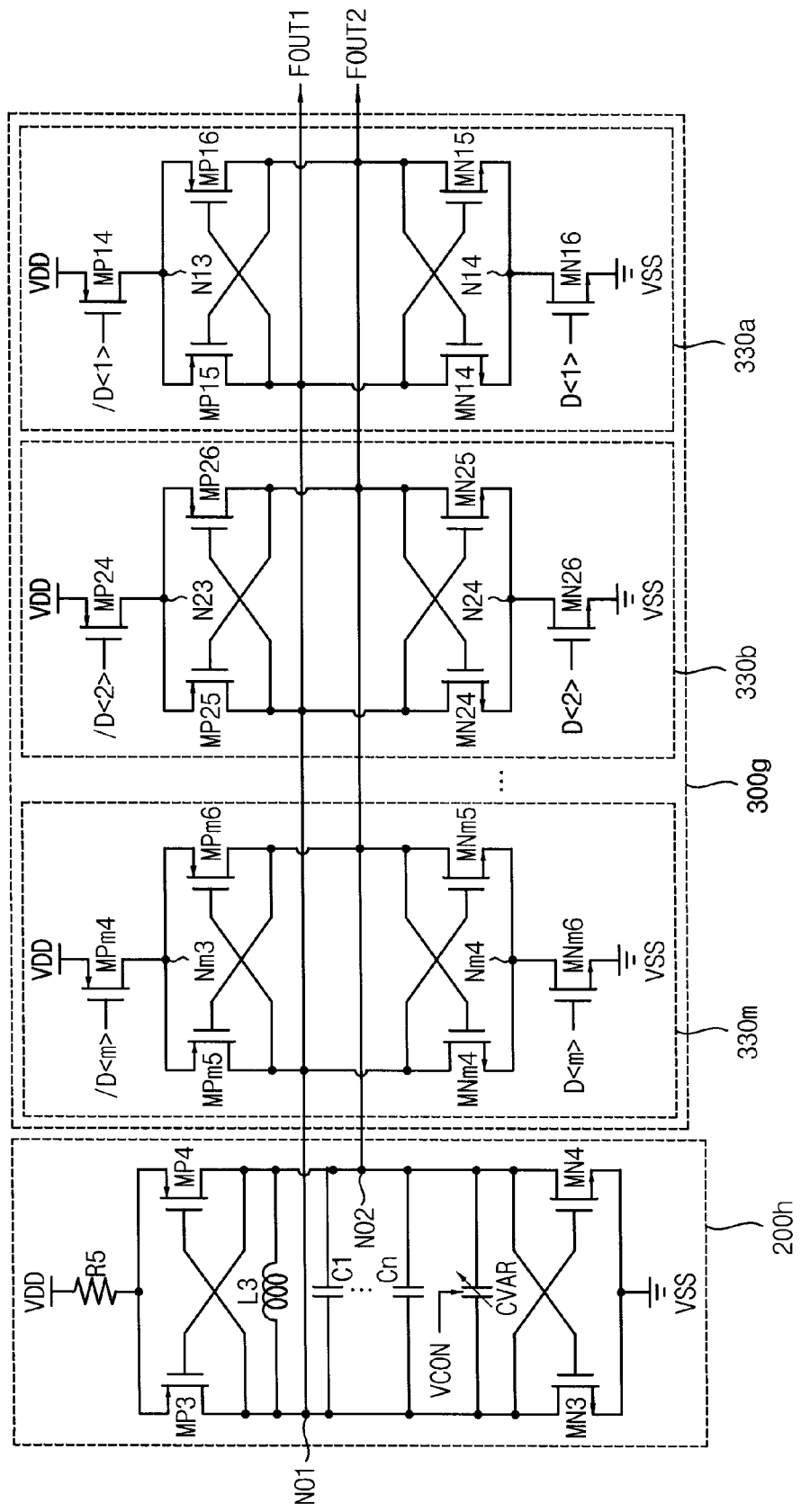
FIGS. 9 and 10 are circuit diagrams illustrating still other example embodiments of the VCO of FIG. 1.
Figure 10:
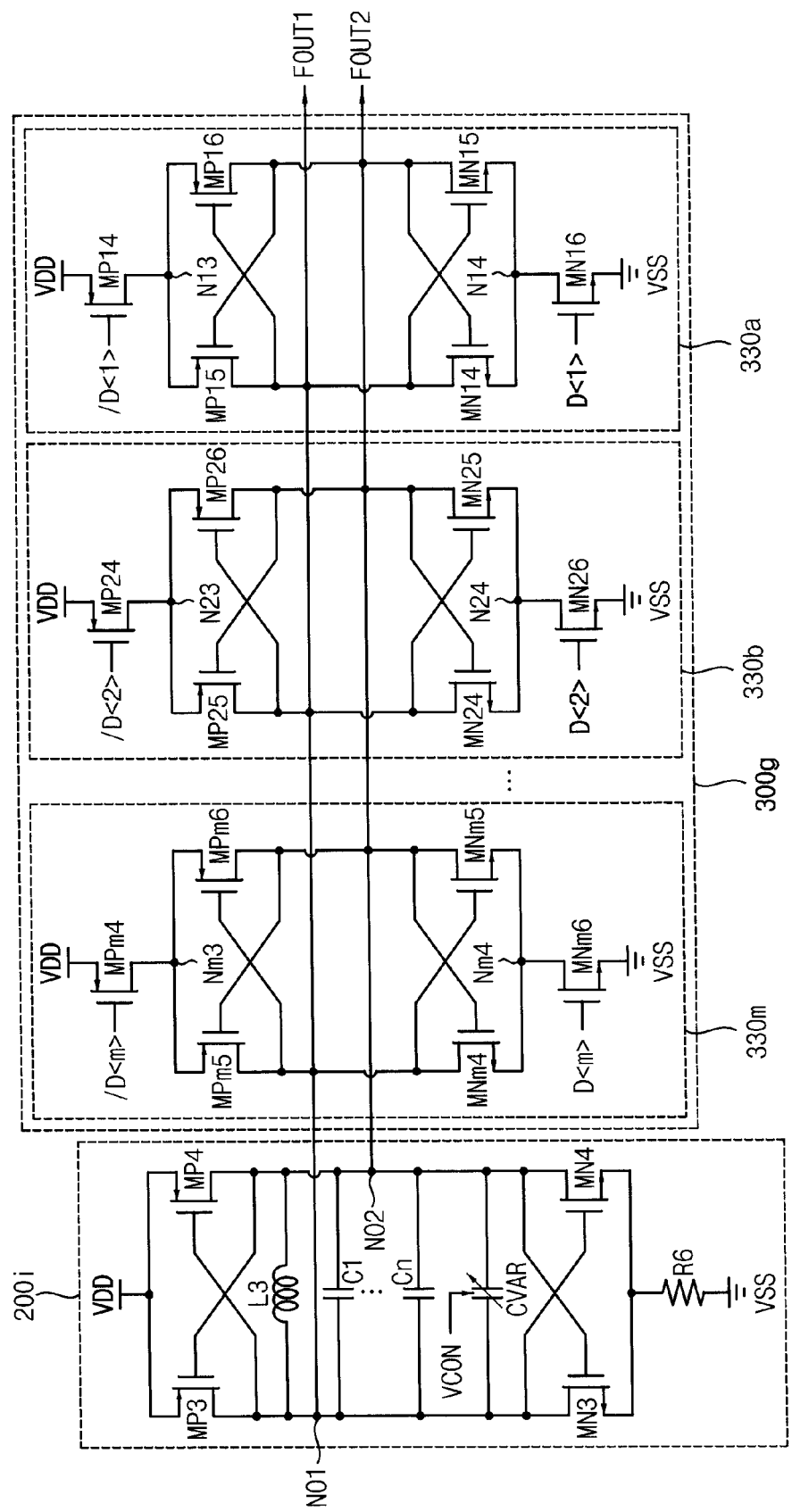

FIGS. 9 and 10 are circuit diagrams illustrating still other examples of the VCO of FIG. 1.

Referring to FIG. 9, a VCO 100h includes an oscillation frequency signal generation unit 200h and the transconductance control unit 300g.

The oscillation frequency signal generation unit 200h may include a resistor R5, the PMOS transistors MP3 and MP4, the inductor L3, the plurality of capacitors C1, . . . , Cn, the varactor CVAR and the NMOS transistors MN3 and MN4. The oscillation frequency signal generation unit 200h in FIG. 9 may be substantially the same as the oscillation frequency signal generation unit 200g in FIG. 8, except that the oscillation frequency signal generation unit 200h in FIG. 9 may further include the resistor R5 connected between the power supply voltage VDD and the PMOS transistors MP3 and MP4.

Referring to FIG. 10, a VCO 100i includes an oscillation frequency signal generation unit 200i and the transconductance control unit 300g.

The oscillation frequency signal generation unit 200i may include the PMOS transistors MP3 and MP4, the inductor L3, the plurality of capacitors C1, ..., Cn, the varactor CVAR, the NMOS transistors MN3 and MN4 and a resistor R6. The oscillation frequency signal generation unit 200i in FIG. 10 may be substantially the same as the oscillation frequency signal generation unit 200g in FIG. 8, except that the oscillation frequency signal generation unit 200i in FIG. 10 may further include the resistor R6 connected between the NMOS transistors MN3 and MN4 and the ground voltage VSS.

Figure 11:
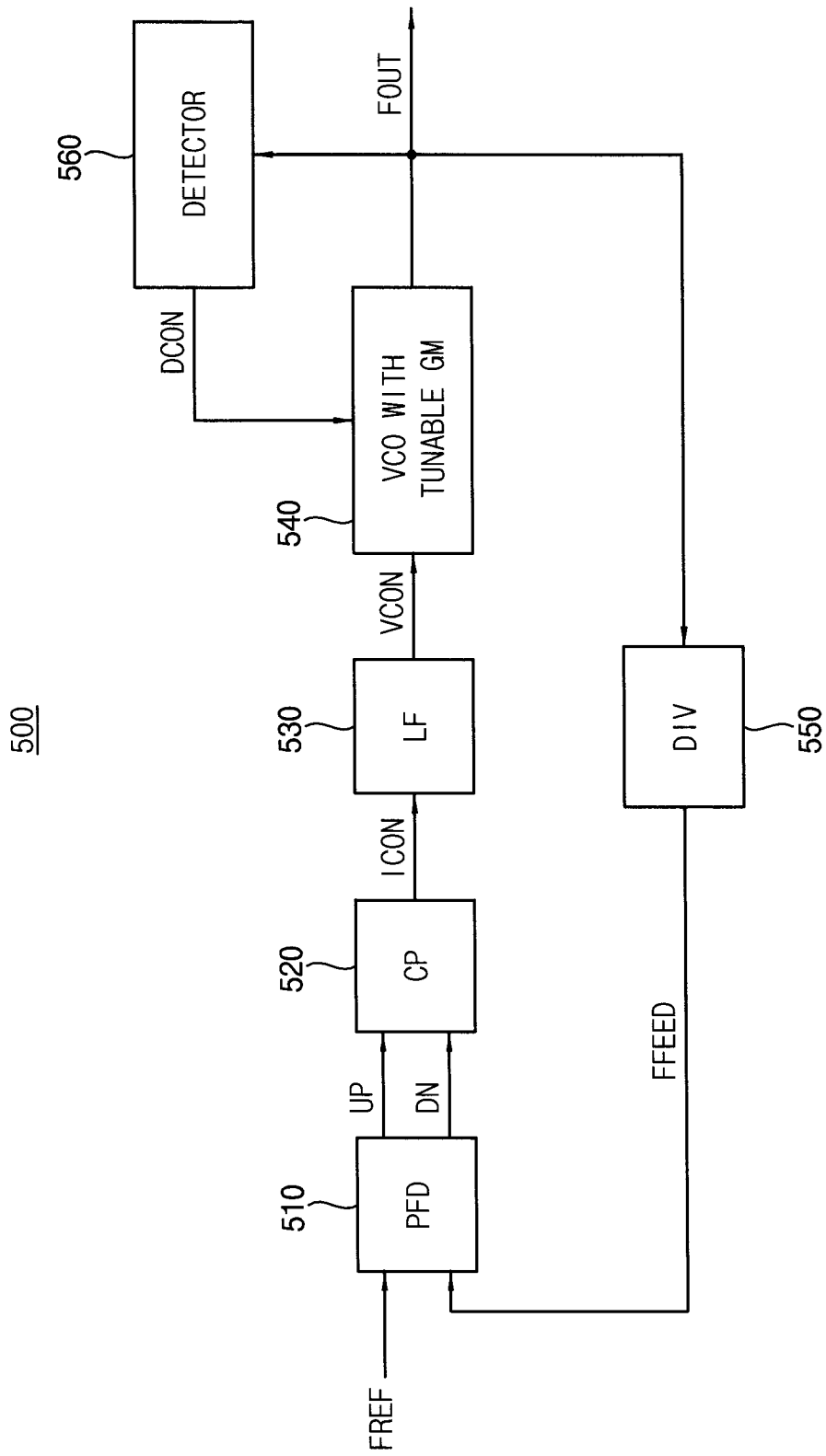
FIG. 11 is a block diagram illustrating a phase locked loop (PLL) including a VCO according to an example embodiment.

FIG. 11 is a block diagram illustrating a phase locked loop (PLL) including a VCO according to an example embodiment.

Referring to FIG. 11, a PLL 500 includes a phase frequency detector 510, a charge pump 520, a loop filter 530, a voltage controlled oscillator (VCO) 540, a frequency divider 550 and a detector 560.

The phase frequency detector 510 generates an up signal UP and a down signal DN corresponding to a phase difference and a frequency difference between a reference signal FREF and a feedback signal FFEED. For example, the up signal UP may be activated when a phase of the reference signal FREF leads a phase of the feedback signal FFEED, and the down signal DN may be activated when the phase of the reference signal FREF lags the phase of the feedback signal FFEED. According to example embodiments, the reference signal FREF may be a wired or wireless signal received from an external circuit or device, or may be an oscillation signal generated by an oscillator located inside or outside the PLL 500. For example, the reference signal FREF may be the oscillation signal generated by a crystal oscillator.

The charge pump 520 generates a current control signal ICON based on the up signal UP and the down signal DN. The loop filter 530 generates a voltage control signal VCON by filtering the current control signal ICON, and maintains the voltage control signal VCON at a constant voltage level. For example, the loop filter 530 may be a low pass filter. The charge pump 520 and the loop filter 530 may increase a level of the voltage control signal VCON in response to the up signal UP, and may decrease the level of the voltage control signal VCON in response to the down signal DN.

The VCO 540 generates an oscillation frequency signal FOUT based on the voltage control signal VCON and a digital control signal DCON. For example, the VCO 540 may increase or decrease a frequency of the oscillation frequency signal FOUT in response to the voltage control signal VCON. A transconductance of the VCO 540 may be tunable based on the digital control signal DCON.

The VCO 540 may be the VCO 100 of FIG. 1, and may be implemented based on one of the examples described above with reference to FIGS. 2 through 10. For example, the VCO 540 may include a transconductance control unit having a plurality of transistors each of which is selectively turned on based on the digital control signal DCON, and thus the VCO 540 may have a tunable transconductance. The transconductance of the VCO 540 may be efficiently controlled digitally without losses of headroom on first and second oscillation frequency signals, which are generated from the VCO 540. The oscillation frequency signal FOUT may be one of the first and second oscillation frequency signals generated from the VCO 540. The VCO 540 may normally operate with a relatively low power supply voltage, a transconductance for satisfying an oscillation condition of the VCO 540 may be efficiently determined, and thus the PLL 500 may have a relatively improved performance.

The frequency divider 550 generates the feedback signal FFEED by dividing the oscillation frequency signal FOUT. In some example embodiments, the PLL 500 may be implemented without the frequency divider 550. In this case, the phase frequency detector 510 may receive the oscillation frequency signal FOUT as the feedback signal FFEED.

The detector 560 generates the digital control signal DCON by detecting information of the oscillation frequency signal FOUT. For example, the detector 560 may detect a variation of an amplitude of the oscillation frequency signal FOUT and/or a variation of a Q factor of the VCO 540 based on a variation of a negative resistance of the VCO 540 to generate the digital control signal DCON for controlling the transconductance of the VCO 540.

Figure 12:
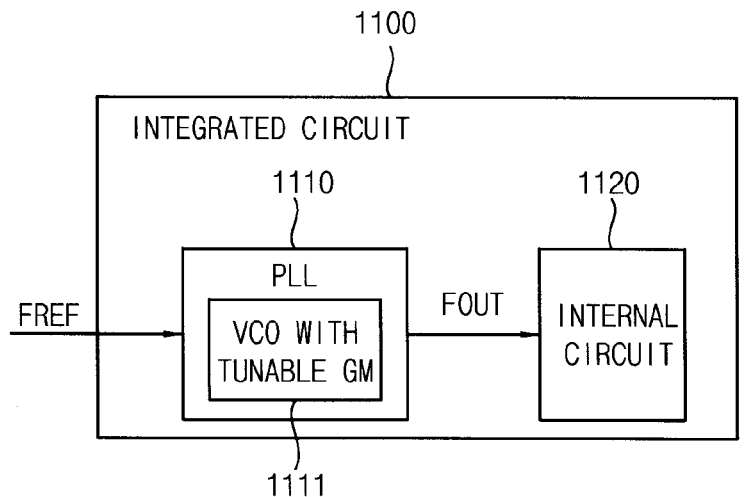
FIG. 12 is a block diagram illustrating an integrated circuit including the PLL according to an example embodiment.

FIG. 12 is a block diagram illustrating an integrated circuit including the PLL according to an example embodiment.

Referring to FIG. 12, an integrated circuit 1100 includes a PLL 1110 and an internal circuit 1120. According to an example embodiment, the integrated circuit 1100 may be an application processor (AP), a microprocessor, a central processing unit (CPU), an application-specific integrated circuit (ASIC), a mobile system-on-chip (SOC), a multimedia SOC, a smart card, or the like.

The PLL 1110 may generate an output signal FOUT having a desired frequency or phase based on a reference signal FREF. According to an example embodiment, the reference signal FREF may be a wired or wireless signal received from an external circuit or device, or may be an oscillation signal generated by an oscillator located inside or outside the PLL 1110. The PLL 1110 may be the PLL 500 of FIG. 10, and may include a VCO 1111 having a tunable transconductance. The VCO 1111 may include a transconductance control unit having a plurality of transistors each of which is selectively turned on based on a digital control signal. Accordingly, a transconductance of the VCO 1111 may be efficiently controlled digitally without losses of headroom on the output signal FOUT, a transconductance for satisfying an oscillation condition of the VCO 1111 may be efficiently determined, and thus the PLL 1110 may have a relatively improved performance.

The internal circuit 1120 may operate based on the output signal FOUT. For example, the internal circuit 1120 may use the output signal FOUT as a clock signal for operating the internal circuit 1120.

Figure 13:
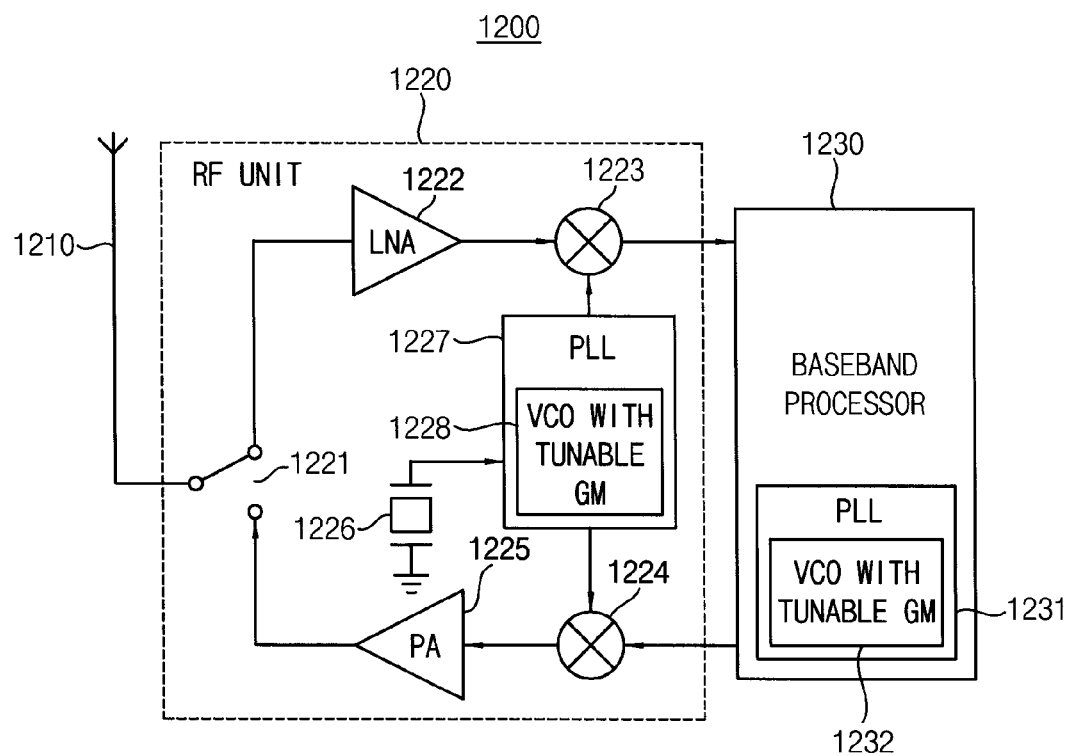
FIG. 13 is a block diagram illustrating a transceiver including the PLL according to an example embodiment.

FIG. 13 is a block diagram illustrating a transceiver including the PLL according to an example embodiment.

Referring to FIG. 13, a transceiver 1200 includes an antenna 1210, a radio frequency (RF) unit 1220 and a baseband processor 1230.

The RF unit 1220 may convert a wireless signal received through the antenna 1210 into a baseband signal to provide the baseband processor 1230 with the baseband signal, and may convert a baseband signal provided from the baseband processor 1230 into a wireless signal to transmit the wireless signal through the antenna 1210. In an example embodiment, the RF unit 1220 may directly convert the received wireless signal into the baseband signal. In another example embodiment, the RF unit 1220 may first convert the received wireless signal into an intermediate frequency (IF) signal, and then may convert the IF signal into the baseband signal. In an example embodiment, the RF unit 1220 may convert the received wireless signal into an in-phase baseband signal and a quadrature baseband signal.

For example, the RF unit 1220 may include a switch 1221, a low noise amplifier (LNA) 1222, a reception mixer 1223, a transmission mixer 1224, a power amplifier (PA) 1225, a local oscillator (LO) 1226 and a first PLL 1227. In an example embodiment, the RF unit 1220 may further include a filter for removing a noise or an out-of-band component of the received wireless signal or for removing an out-of-band spurious component of the wireless signal to be transmitted. According to an example embodiment, the RF unit 1220 may further include a variable gain amplifier, a low pass filter, etc.

The switch 1221 may selectively couple the antenna 1210 to a reception path or a transmission path. The LNA 1222 may have a low noise figure to reduce an influence of a noise, and may amplify the wireless signal received through the antenna 1210. The reception mixer 1223 may down-convert the wireless signal amplified by the LNA 1222 into the baseband signal by mixing the wireless signal with an output signal of the first PLL 1227. The transmission mixer 1224 may up-convert a baseband signal provided from the baseband processor 1230 into a wireless signal by mixing the baseband signal with the output signal of the first PLL 1227. The PA 1225 may amplify the wireless signal that is up-converted by the transmission mixer 1224 such that a wireless signal transmitted through the antenna 1210 has a power greater than a predetermined power. The LO 1226 may generate an oscillation signal. For example, the LO 1226 may include a crystal oscillator. The first PLL 1227 may generate an output signal having a desired frequency based on the oscillation signal provided from the LO 1226.

The baseband processor 1230 may perform data processing based on the baseband signal received from the RF unit 1220, and may generate a baseband signal to be transmitted to provide the RF unit 1220 with the baseband signal to be transmitted. For example, the baseband processor 1230 may include a physical layer processor (PHY) for generating a data stream by demodulating a baseband signal received from the RF unit 1220 and for generating the baseband signal to be provided to the RF unit 1220 by modulating a data steam. According to example embodiments, the PHY may include a fast Fourier transformer (FFT), a demapper, a deinterleaver, a channel decoder, etc. to demodulate the baseband signal, and may include a channel encoder, an interleaver, a mapper, an inverse fast Fourier transformer (IFFT), etc. to modulate the data stream.

The baseband processor 1230 may include a second PLL 1231. For example, the baseband processor 1230 may use an output signal of the second PLL 1231 as a clock signal for operating the baseband processor 1230.

The first and second PLLs 1227 and 1231 may include a VCO 1228 and a VCO 1232, respectively, each of which has a tunable transconductance. Each of the VCOs 1228 and 1232 may include a transconductance control unit having a plurality of transistors each of which is selectively turned on based on a digital control signal. Accordingly, a transconductance of the VCO 1228 and a transconductance of the VCO 1232 may be efficiently controlled digitally without losses of headroom on the output signals, transconductances for satisfying oscillation conditions of the VCOs 1228 and 1232 may be efficiently determined, and thus the first and second PLLs 1227 and 1231 may have relatively improved performances.

Figure 14:
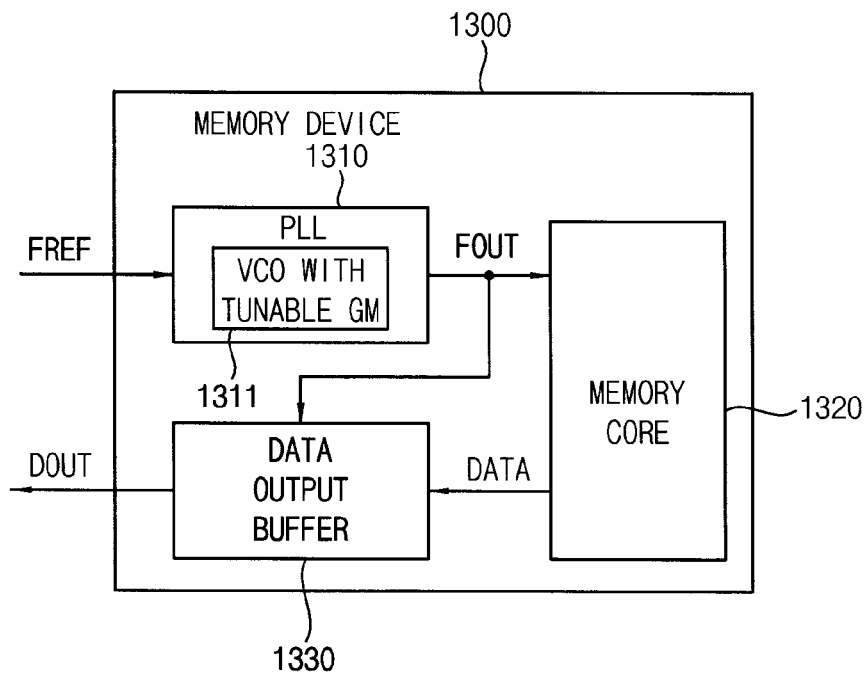
FIG. 14 is a block diagram illustrating a memory device including the PLL according to an example embodiment.

FIG. 14 is a block diagram illustrating a memory device including the PLL according to an example embodiment.

Referring to FIG. 14, a memory device 1300 includes a PLL 1310, a memory core 1320 and a data output buffer 1330. According to an example embodiment, the memory device 1300 may be a dynamic random access memory (DRAM), a mobile DRAM, a static random access memory (SRAM), an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The PLL 1310 may generate an output signal FOUT having a desired frequency based on a reference signal FREF. The PLL 1310 may include a VCO 1311 having a tunable transconductance. The VCO 1311 may include a transconductance control unit having a plurality of transistors each of which is selectively turned on based on a digital control signal. Accordingly, a transconductance of the VCO 1311 may be efficiently controlled digitally without losses of headroom on the output signal FOUT, a transconductance for satisfying an oscillation condition of the VCO 1311 may be efficiently determined, and thus the PLL 1310 may have a relatively improved performance.

The memory core 1320 may perform a write operation that stores data provided from a data input buffer (not illustrated), and may perform a read operation that provides the stored data DATA to the data output buffer 1330. The memory core 1320 may perform the write operation and/or the read operation based on the output signal FOUT of the PLL 1310. The memory core 1320 may include a memory cell array having a plurality of memory cells for storing data, row and column decoders selecting a wordline and a bitline of the memory cell array based on an address signal, and a sense amplifier sensing the data stored in selected memory cells.

The data output buffer 1330 may output the data DATA provided from the memory core 1320 as output data DOUT in response to the output signal FOUT of the PLL 1310. The output data DOUT may be synchronized with the output signal FOUT of the PLL 1310, and may be provided to an external device, such as a memory controller.

Figure 15:
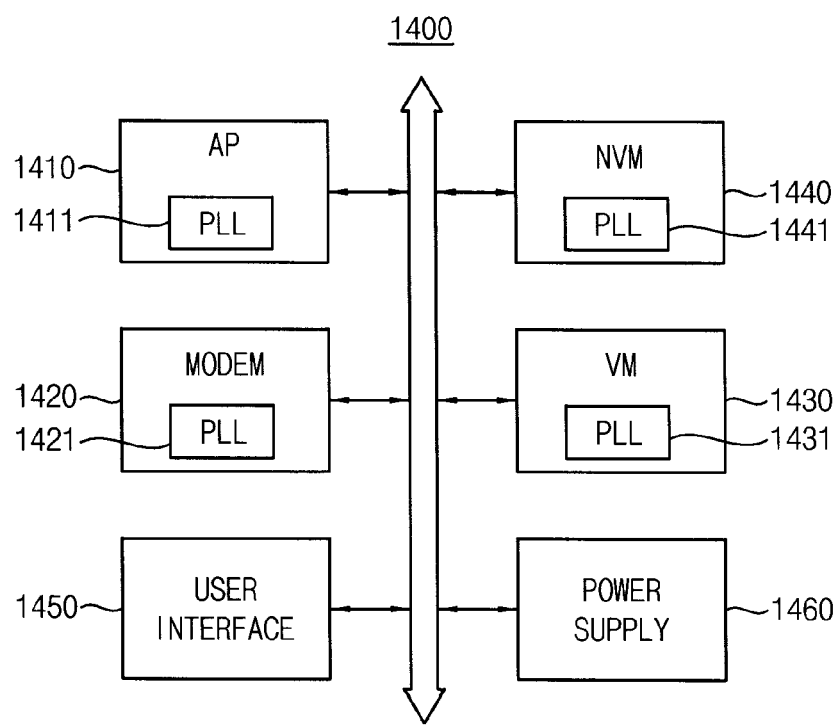
FIG. 15 is a block diagram illustrating a mobile system including the PLL according to an example embodiment.

FIG. 15 is a block diagram illustrating a mobile system including the PLL according to an example embodiment.

Referring to FIG. 15, a mobile system 1400 includes an application processor 1410, a modem 1420, a volatile memory device 1430, a nonvolatile memory device 1440, a user interface 1450 and a power supply 1460. According to an example embodiment, the mobile system 1400 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation system, etc.

The application processor 1410 may execute applications, such as an internet browser, a game application, a video player application, etc. The application processor 1410 may include a first PLL 1411. The application processor 1410 may operate based on a clock signal generated by the first PLL 1411. According to an example embodiment, the application processor 1410 may include a single processor core or a plurality of processor cores. In an example embodiment, the application processor 1410 may further include a cache memory located inside or outside the application processor 1410.

The modem 1420 may perform wired or wireless communication with an external device. For example, the modem 1420 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The modem 1420 may include a baseband chipset. The modem 1420 may further include a second PLL 1421.

The volatile memory device 1430 may store an instruction/data processed by the application processor 1410, or may serve as a working memory. For example, the volatile memory device 1430 may be implemented by a dynamic random access memory (DRAM), a static random access memory (SRAM), a mobile DRAM, or the like. The volatile memory device 1430 may include a third PLL 1431.

The nonvolatile memory device 1440 may store a boot image for booting the mobile system 1400. For example, the nonvolatile memory device 1440 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. The nonvolatile memory device 1440 may include a fourth PLL 1441.

Each of the first, second, third and fourth PLL 1411, 1421, 1431 and 1441 may include a VCO having a tunable transconductance. The VCO may include a transconductance control unit having a plurality of transistors each of which is selectively turned on based on a digital control signal. Accordingly, a transconductance of the VCO may be efficiently controlled digitally without losses of headroom on the output signal, a transconductance for satisfying an oscillation condition of the VCO may be efficiently determined, and thus the first, second, third and fourth PLL 1411, 1421, 1431 and 1441 may have relatively improved performances.

The user interface 1450 may include at least one input device, such as a keypad, a touch screen, etc., and at least one output device, such as a display device, a speaker, etc. The power supply 1460 may supply the mobile system 1400 with power. In some example embodiments, the mobile system 1400 may further include a camera image processor (CIS), storage device, such as a memory card, a solid state drive (SDD), a CD-ROM, etc.

According to an example embodiment, the mobile system 1400 and/or components of the mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Figure 16:
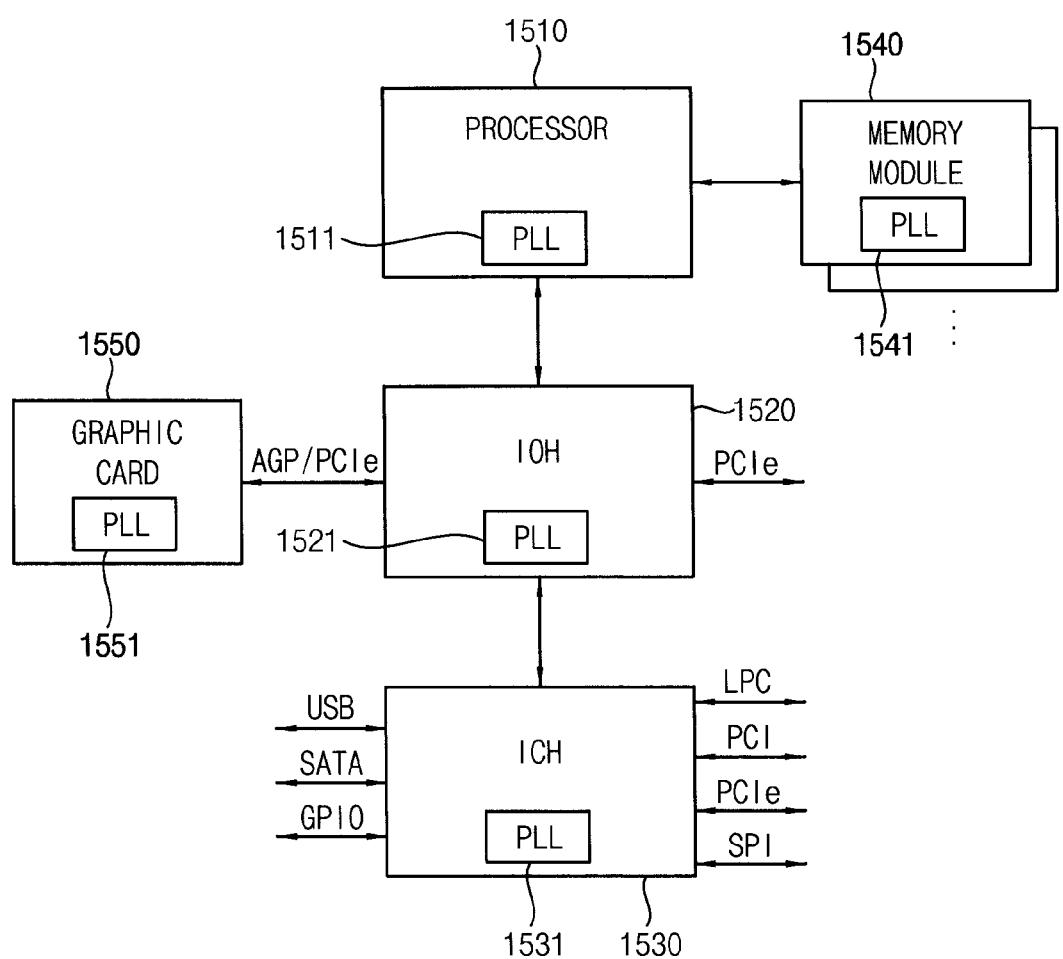
FIG. 16 is a block diagram illustrating a computing system including the PLL according to an example embodiment.

FIG. 16 is a block diagram illustrating a computing system including the PLL according to an example embodiment.

Referring to FIG. 16, a computing system 1500 includes a processor 1510, an input/output hub 1520, an input/output controller hub 1530, at least one memory module 1540 and a graphic card 1550. According to an example embodiment, the computing system 1500 may be any computing system, such as a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device, etc.

The processor 1510 may perform specific calculations or tasks. For example, the processor 1510 may be a microprocessor, a central process unit (CPU), a digital signal processor, or the like. The processor 1510 may include a first PLL 1511. The processor 1510 may operate based on a clock signal generated by the first PLL 1511. According to an example embodiment, the processor 1510 may include a single processor core or a plurality of processor cores. Although FIG. 16 illustrates an example of the computing system 1500 including one processor 1510, according to an example embodiment, the computing system 1500 may include a plurality of processors. In an example embodiment, the processor 1510 may further include a cache memory located inside or outside the processor 1510.

The processor 1510 may include a memory controller (not illustrated) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. In an example embodiment, the memory controller may be included in the input/output hub 1520. The input/output hub 1520 including the memory controller may be referred to as a memory controller hub (MCH).

The memory module 1540 may include a plurality of memory devices that store data provided from the memory controller. The memory module 1540 may include a fourth PLL 1541. In an example embodiment, the fourth PLL 1541 may be disposed on the memory module 1540, and may be used to operate a buffer between the memory controller and the memory devices. In another example embodiment, the PLL 1541 may be disposed on each memory device, and may be used to operate each memory device.

The input/output hub 1520 may manage data transfer between the processor 1510 and devices, such as the graphic card 1550. The input/output hub 1520 may include a second PLL 1521. The input/output hub 1520 may be coupled to the processor 1510 via at least one of various interfaces, such as a front side bus (FSB), a system bus, a HyperTransport, a lightning data transport (LDT), a QuickPath interconnect (QPI), a common system interface (CSI), etc. Although FIG. 16 illustrates an example of the computing system 1500 including one input/output hub 1520, according to an example embodiment, the computing system 1500 may include a plurality of input/output hubs.

The input/output hub 1520 may provide various interfaces with the devices. For example, the input/output hub 1520 may provide an accelerated graphics port (AGP) interface, a peripheral component interface-express (PCIe), a communications streaming architecture (CSA) interface, etc.

The graphic card 1550 may be coupled to the input/output hub 1520 via the AGP or the PCIe. The graphic card 1550 may control a display device (not shown) for displaying an image. The graphic card 1550 may include an internal processor and an internal memory to process the image. The graphic card 1550 may further include a fifth PLL 1551. In some example embodiments, the input/output hub 1520 may include an internal graphic device along with or instead of the graphic card 1550. The internal graphic device may be referred to as an integrated graphics, and an input/output hub including the memory controller and the internal graphic device may be referred to as a graphics and memory controller hub (GMCH).

The input/output controller hub 1530 may perform data buffering and interface arbitration to efficiently operate various system interfaces. The input/output controller hub 1530 may include a third PLL 1531.

Each of the first, second, third, fourth and fifth PLL 1511, 1521, 1531, 1541 and 1551 may include a VCO having a tunable transconductance. The VCO may include a transconductance control unit having a plurality of transistors each of which is selectively turned on based on a digital control signal. Accordingly, a transconductance of the VCO may be efficiently controlled digitally without losses of headroom on the output signal, a transconductance for satisfying an oscillation condition of the VCO may be efficiently determined, and thus the first, second, third, fourth and fifth PLL 1511, 1521, 1531, 1541 and 1551 may have relatively improved performances.

The input/output controller hub 1530 may be coupled to the input/output hub 1520 via an internal bus. For example, the input/output controller hub 1530 may be coupled to the input/output hub 1520 via at least one of various interfaces, such as a direct media interface (DMI), a hub interface, an enterprise Southbridge interface (ESI), PCIe, etc.

The input/output controller hub 1530 may provide various interfaces with peripheral devices. For example, the input/output controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In an example embodiment, the processor 1510, the input/output hub 1520 and the input/output controller hub 1530 may be implemented as separate chipsets or separate integrated circuits. In another example embodiment, at least two of the processor 1510, the input/output hub 1520 and the input/output controller hub 1530 may be implemented as one chipset.

The above described embodiments may be used in any device or system including a PLL, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage controlled oscillator (VCO) comprising:
    an oscillation frequency signal generation circuit having a first transconductance, the oscillation frequency signal generation circuit configured to generate a first oscillation frequency signal and a second oscillation frequency signal based on a voltage control signal and a power supply voltage, the first and second oscillation frequency signals being a pair of differential signals, the oscillation frequency signal generation circuit configured to output the first oscillation frequency signal from a first output node, the oscillation frequency signal generation circuit configured to output the second oscillation frequency signal from a second output node; and
    a transconductance control circuit connected to the first and second output nodes, the transconductance control circuit having a second transconductance, and the transconductance control circuit configured to adjust the second transconductance based on a digital control signal,
    the VCO having a negative resistance based on the first transconductance and the second transconductance.

2. The VCO of claim 1, wherein the transconductance control circuit includes:
    a plurality of sub-control blocks connected in parallel between the first output node and the second output node, the transconductance control circuit configured to selectively enable each sub-control block based on a respective one bit of the digital control signal.

3. The VCO of claim 2, wherein each sub-control block has a sub-transconductance, and the second transconductance corresponds to a sum of sub-transconductances of enabled sub-control blocks.

4. The VCO of claim 2, wherein each sub-control block includes:
    a first n-type metal oxide semiconductor (NMOS) transistor having a first electrode connected to the first output node, a control electrode connected to the second output node and a second electrode connected to a first common node;
    a second NMOS transistor having a first electrode connected to the second output node, a control electrode connected to the first output node and a second electrode connected to the first common node; and
    a third NMOS transistor having a first electrode connected to the first common node, a control electrode configured to receive the respective one bit of the digital control signal and a second electrode configured to receive a ground voltage.

5. The VCO of claim 2, wherein each sub-control block includes:
    a first p-type metal oxide semiconductor (PMOS) transistor having a first electrode configured to receive the power supply voltage, a control electrode configured to receive a respective one bit of an inversion signal of the digital control signal and a second electrode connected to a first common node;
    a second PMOS transistor having a first electrode connected to the first common node, a control electrode connected to the second output node and a second electrode connected to the first output node; and
    a third PMOS transistor having a first electrode connected to the first common node, a control electrode connected to the first output node and a second electrode connected to the second output node.

6. The VCO of claim 5, wherein each sub-control block further includes:
    a first NMOS transistor having a first electrode connected to the first output node, a control electrode connected to the second output node and a second electrode connected to a second common node;
    a second NMOS transistor having a first electrode connected to the second output node, a control electrode connected to the first output node and a second electrode connected to the second common node; and
    a third NMOS transistor having a first electrode connected to the second common node, a control electrode configured to receive the respective one bit of the digital control signal and a second electrode configured to receive a ground voltage.

7. The VCO of claim 2, wherein sub-transconductances of the plurality of sub-control blocks are substantially the same as each other.

8. The VCO of claim 1, wherein the oscillation frequency signal generation circuit includes:
an inductor connected between the first output node and the second output node, the inductor configured to receive the power supply voltage;
a plurality of capacitors connected in parallel between the first output node and the second output node;
a varactor connected between the first output node and the second output node, the varactor having a capacitance based on the voltage control signal;
a first NMOS transistor having a first electrode connected to the first output node, a control electrode connected to the second output node and a second electrode configured to receive a ground voltage; and
a second NMOS transistor having a first electrode connected to the second output node, a control electrode connected to the first output node and a second electrode configured to receive the ground voltage.

9. The VCO of claim 8, wherein the oscillation frequency signal generation circuit further includes:
a first resistor connected between a power supply voltage source and the inductor, the power supply voltage source configured to generate the power supply voltage.

10. The VCO of claim 8, wherein the oscillation frequency signal generation circuit further includes:
a first resistor connected between the first and second NMOS transistors and a ground voltage source.

11. The VCO of claim 1, wherein the oscillation frequency signal generation circuit includes:
a first PMOS transistor having a first electrode configured to receive the power supply voltage, a control electrode connected to the second output node and a second electrode connected to the first output node;
a second PMOS transistor having a first electrode configured to receive the power supply voltage, a control electrode connected to the first output node and a second electrode connected to the second output node;
a plurality of capacitors connected in parallel between the first output node and the second output node;
a varactor connected between the first output node and the second output node, the varactor having a capacitance based on the voltage control signal; and
an inductor connected between the first output node and the second output node, the inductor configured to receive a ground voltage.

12. The VCO of claim 1, wherein the oscillation frequency signal generation circuit includes:
a first PMOS transistor having a first electrode configured to receive the power supply voltage, a control electrode connected to the second output node and a second electrode connected to the first output node;
a second PMOS transistor having a first electrode configured to receive the power supply voltage, a control electrode connected to the first output node and a second electrode connected to the second output node;
an inductor connected between the first output node and the second output node;
a plurality of capacitors connected in parallel between the first output node and the second output node;
a varactor connected between the first output node and the second output node, the varactor having a capacitance based on the voltage control signal; and
a first NMOS transistor having a first electrode connected to the first output node, a control electrode connected to the second output node and a second electrode configured to receive a ground voltage; and
a second NMOS transistor having a first electrode connected to the second output node, a control electrode connected to the first output node and a second electrode configured to receive the ground voltage.

13. The VCO of claim 1, wherein the VCO is a LC VCO including at least one inductor and at least one capacitor.

14. The VCO of claim 1, wherein the negative resistance corresponds to a negative representation of a first resistance, the first resistance corresponds to a reciprocal of a third transconductance, and the third transconductance corresponds to a sum of the first transconductance and the second transconductance.

15. A phase locked loop (PLL) comprising:
a phase frequency detector configured to generate an up signal and a down signal corresponding to a phase difference and a frequency difference between a reference signal and a feedback signal;
a charge pump configured to generate a current control signal based on the up signal and the down signal;
a loop filter configured to generate a voltage control signal by filtering the current control signal;
a voltage controlled oscillator (VCO) configured to generate an oscillation frequency signal based on the voltage control signal and a digital control signal;
a frequency divider configured to generate the feedback signal by dividing the oscillation frequency signal; and
a detector configured to generate the digital control signal by detecting information of the oscillation frequency signal,
wherein the oscillation frequency signal corresponds to one of a first oscillation frequency signal and a second oscillation frequency signal being a pair of differential signals,
wherein the VCO includes,
an oscillation frequency signal generation circuit having a first transconductance, the oscillation frequency signal generation circuit configured to generate the first and second oscillation frequency signals based on the voltage control signal and a power supply voltage, the oscillation frequency signal generation circuit configured to output the first oscillation frequency signal from a first output node, the oscillation frequency signal generation circuit configured to output the second oscillation frequency signal from a second output node, and
a transconductance control circuit connected to the first and second output nodes, the transconductance control circuit having a second transconductance, and the transconductance control circuit configured to adjust the second transconductance based on the digital control signal,
the VCO having a negative resistance based on the first transconductance and the second transconductance.

16. A voltage controlled oscillator (VCO) configured to generate an output frequency signal based on a transconductance of the VCO, the VCO comprising:
an oscillation frequency signal generation circuit configured to generate the output frequency signal; and a transconductance control circuit configured to adjust the transconductance of the VCO based on a digital control signal.

17. The VCO of claim 16, wherein the oscillation frequency signal generation circuit includes first and second output nodes, and the transconductance control circuit is connected between the first and second output nodes.

18. The VCO of claim 17, wherein the transconductance control circuit includes:

a plurality of sub-control blocks connected in parallel between the first output node and the second output node, the transconductance control circuit configured to selectively enable each sub-control block based on a respective one bit of the digital control signal.

19. The VCO of claim 16, wherein the digital control signal is based on an amplitude of the output frequency signal.

20. The VCO of claim 16, wherein the oscillation frequency signal generation circuit does not include a resistor.

* * * * *